(12) United States Patent
Lin et al.

(10) Patent No.: US 9,748,454 B2
(45) Date of Patent: Aug. 29, 2017

(54) LED PACKAGE STRUCTURE AND CHIP CARRIER

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Chen-Hsiu Lin, New Taipei (TW); Kuo-Ming Chiu, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/954,364

(22) Filed: Nov. 30, 2015

(65) Prior Publication Data
US 2016/0380171 A1    Dec. 29, 2016

(30) Foreign Application Priority Data

Jun. 29, 2015  (CN) .......................... 2015 1 0369949

(51) Int. Cl.
| | |
|---|---|
| H01L 33/58 | (2010.01) |
| H01L 33/60 | (2010.01) |
| H01L 33/48 | (2010.01) |
| H01L 33/64 | (2010.01) |
| H01L 33/62 | (2010.01) |

(52) U.S. Cl.
CPC ............ H01L 33/60 (2013.01); H01L 33/486 (2013.01); H01L 33/642 (2013.01); *H01L 33/62* (2013.01); *H01L 2224/48091* (2013.01); *H01L 2224/48465* (2013.01)

(58) Field of Classification Search
CPC ......... H01L 33/60; H01L 33/62; H01L 33/58; H01L 33/486; H01L 33/642
See application file for complete search history.

(56) References Cited

U.S. PATENT DOCUMENTS

| | | | | |
|---|---|---|---|---|
| 6,246,111 B1 * | 6/2001 | Huang | ................... | H01L 21/565 257/666 |
| 2009/0091021 A1 * | 4/2009 | Nakamura | ............ | H01L 21/563 257/707 |

(Continued)

*Primary Examiner* — Fazli Erdem
(74) *Attorney, Agent, or Firm* — Li & Cai Intellectual Property (USA) Office

(57) ABSTRACT

An LED package structure includes a chip carrier and an LED chip. The chip carrier includes a ceramic substrate, a circuit layer, a ceramic reflective plate disposed on the ceramic substrate, and a metal slug. The ceramic substrate has a first thru-hole. A main portion of the metal slug is embedded in the first thru-hole, and partially protrudes from the first thru-hole with a height of 10~30 μm to define as a protrusion block. An extending portion of the metal slug is connected to the outer edge of protrusion block, and the top surfaces of extending portion and protrusion block are coplanar to define a mounting surface. The ceramic reflective plate has a second thru-hole, and the mounting surface is exposed from the ceramic reflective plate via the second thru-hole. The LED chip is fixed on the mounting surface and is electrically connected to the circuit layer.

20 Claims, 25 Drawing Sheets

(56) References Cited

U.S. PATENT DOCUMENTS

| | | | | |
|---|---|---|---|---|
| 2013/0256733 A1* | 10/2013 | Lin | ........................ | H01L 33/62 |
| | | | | 257/99 |
| 2014/0291706 A1* | 10/2014 | Lin | ........................ | H01L 33/52 |
| | | | | 257/88 |
| 2014/0299894 A1* | 10/2014 | Lin | ........................ | F21K 9/00 |
| | | | | 257/88 |
| 2014/0340353 A1* | 11/2014 | Chen | .................... | H03K 17/962 |
| | | | | 345/174 |
| 2015/0034986 A1* | 2/2015 | Lee | ........................ | H01L 27/15 |
| | | | | 257/98 |

* cited by examiner

LED PACKAGE STRUCTURE AND CHIP CARRIER

BACKGROUND OF THE INVENTION

1. Field of the Invention

The instant invention relates to a package structure; in particular, to an LED package structure and a chip carrier.

2. Description of Related Art

The conventional high power LED package structure is provided with high technical demands, such as wavelength, illuminance, and heat dissipation. The conventional high power LED package structure always adapts high temperature co-fired ceramic (HTCC) package. However, the co-fired temperature and cost for HTCC package is too high. Therefore, the development of high power LED package structure is restricted due to above reasons.

SUMMARY OF THE INVENTION

The instant disclosure provides an LED package structure and a chip carrier for effectively solving the problems generated from the conventional high power LED package structure.

In summary, the chip carrier of the LED package structure disclosed in the instant embodiment is provided with the main portion of the metal slug protruding from the accommodating hole, thereby avoiding generating a concave mounting surface. Moreover, the metal slug is provided with the extending portion to effectively increase an area of mounting surface of the metal slug, thereby the mounting surface of the metal slug allows the LED chips to be applied with different sizes.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

[First Embodiment]

Please refer to FIGS. 1 through 11, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

Figure 1:
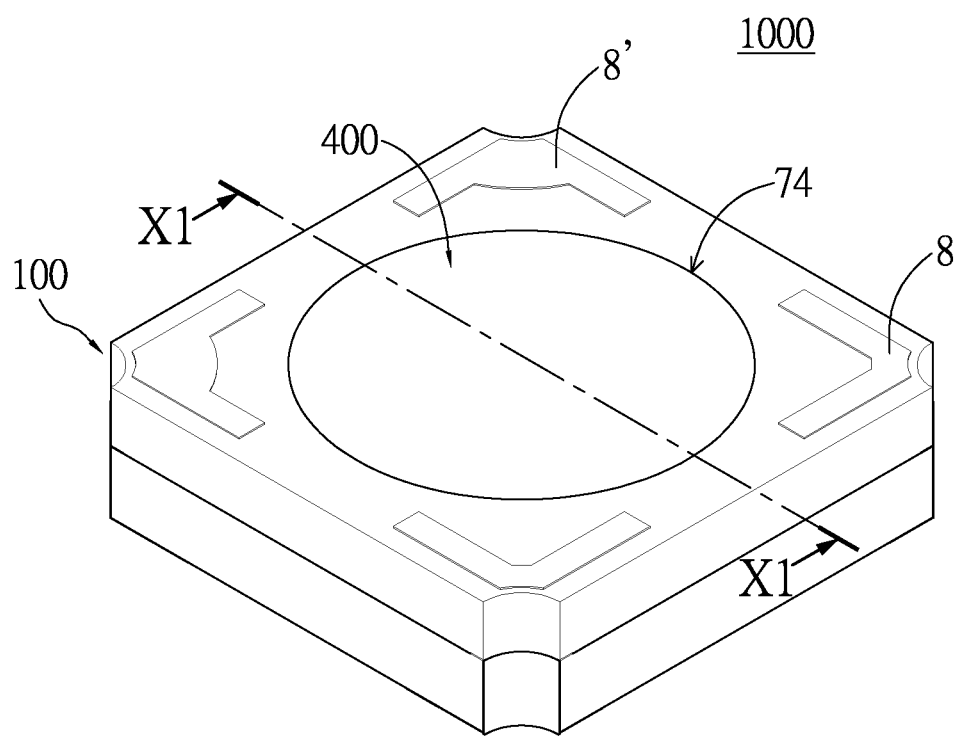
FIG. 1 is a perspective view showing an LED package structure according to a first embodiment of the instant disclosure.
Figure 2:
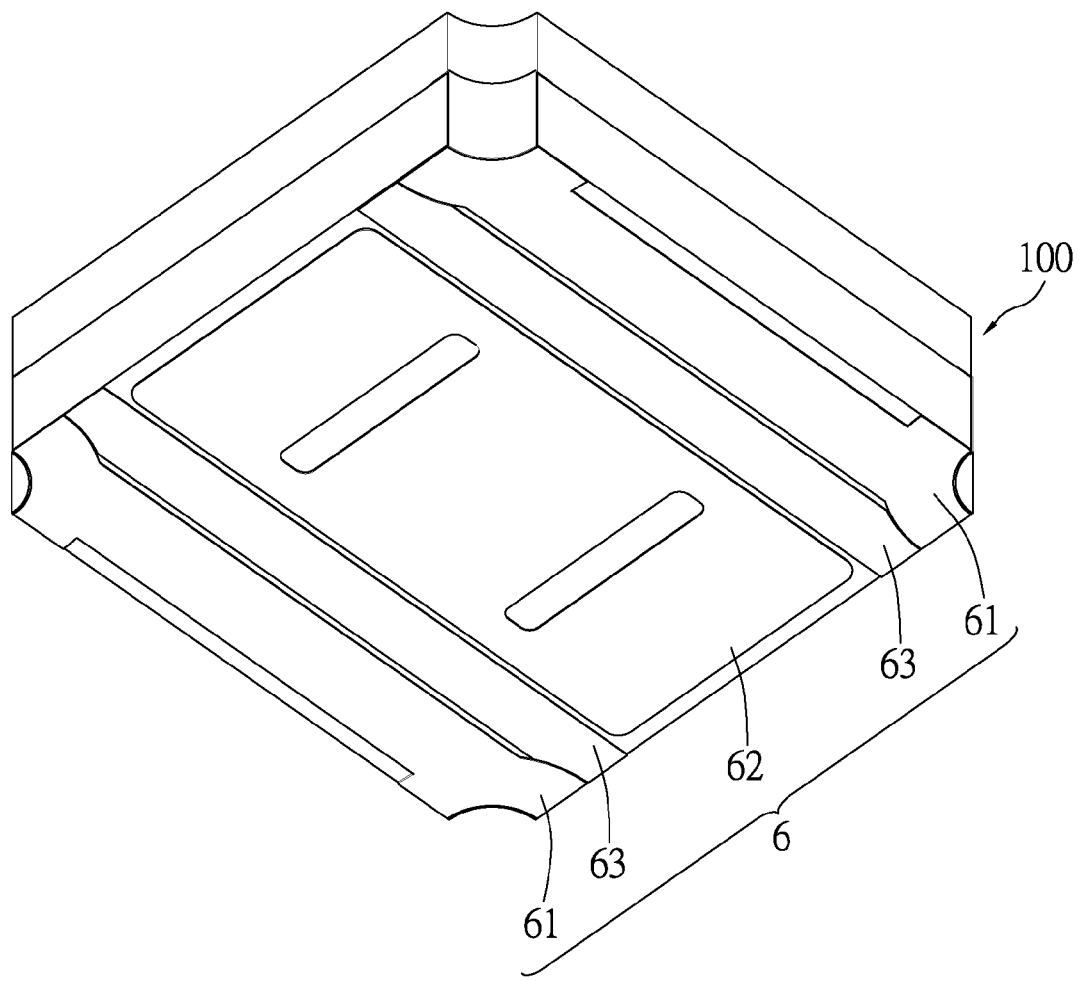
FIG. 2 is an another perspective view of FIG. 1.

Please refer to FIGS. 1 and 2, which show an LED package structure 1000 of the instant embodiment; in particular, a high power LED package structure (e.g., UV LED package structure). The LED package structure 1000 is preferably prepared by using a Low Temperature Co-fired Ceramic (LTCC) technique, but it is not limited thereto.

Figure 3:
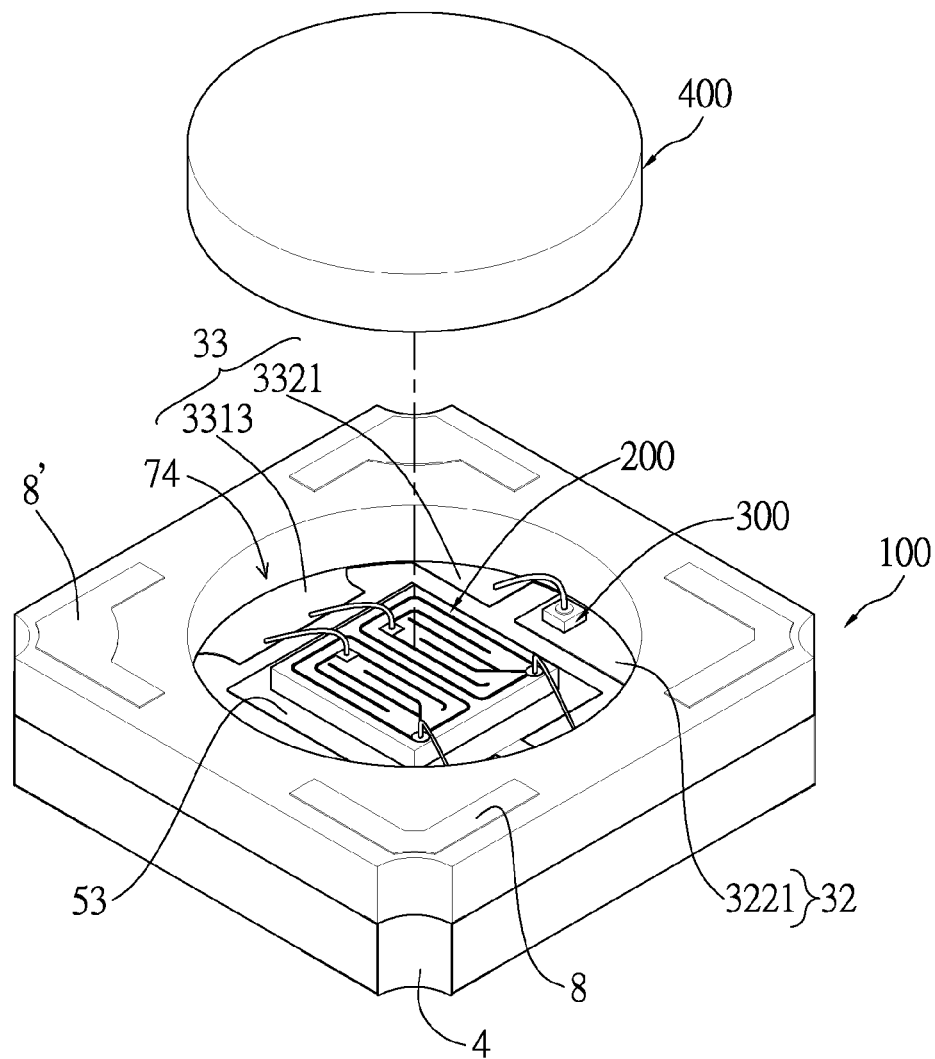
FIG. 3 is an exploded view of FIG. 1 showing the encapsulation resin the separated from the LED package structure.
Figure 4:
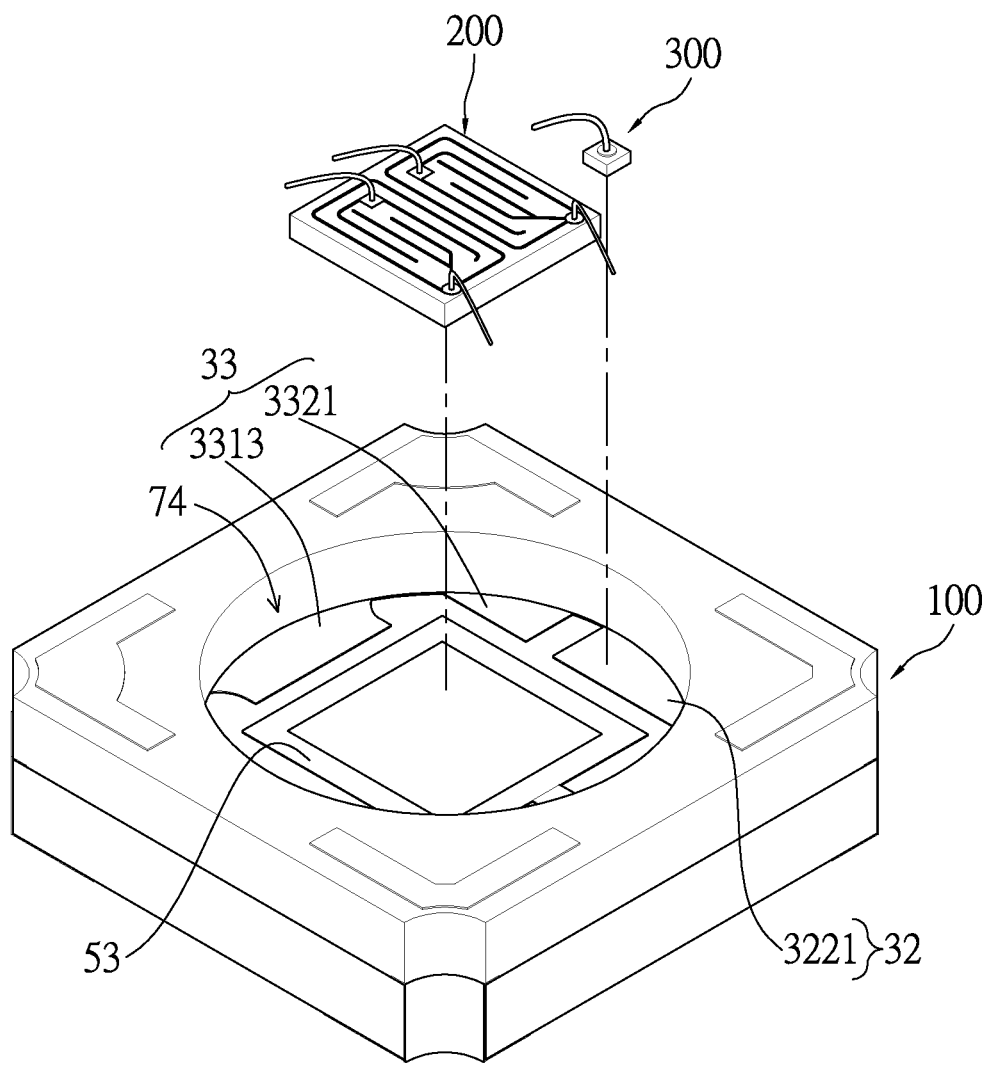
FIG. 4 is an exploded view showing the LED chip and the Zener-diode chip separated from the chip carrier.
Figure 5:
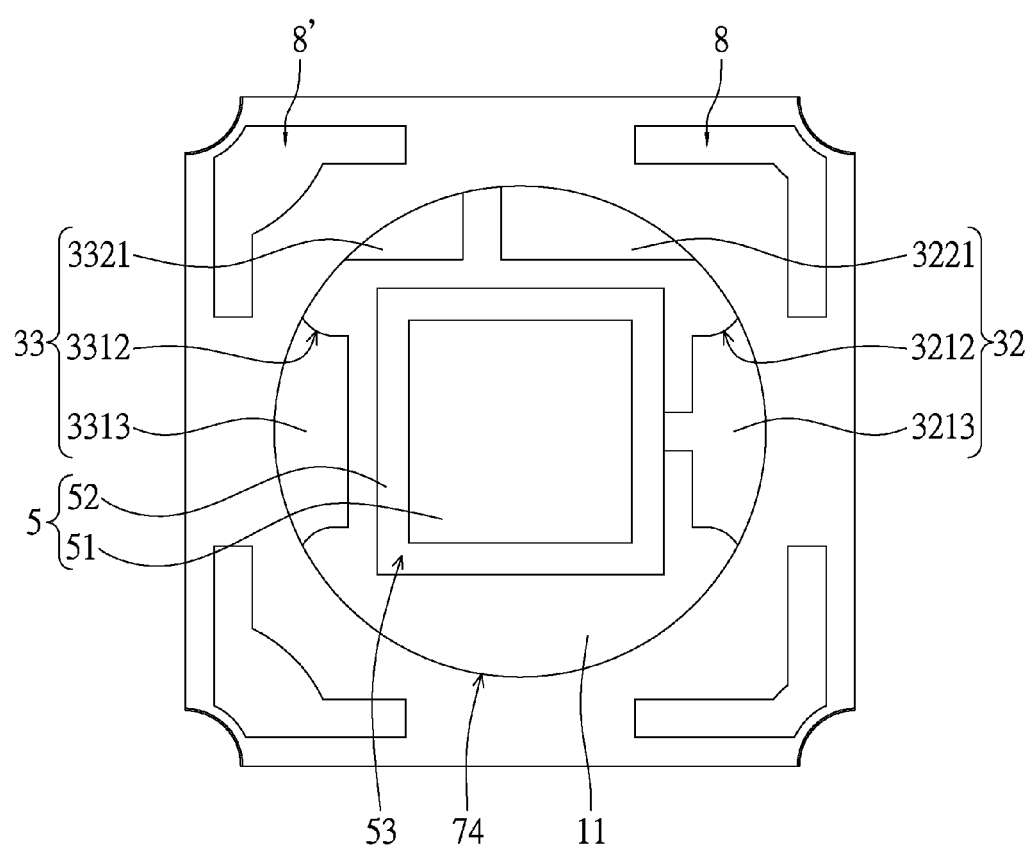
FIG. 5 is a top view of the chip carrier shown in FIG. 4.

As shown in FIGS. 3 through 5, the LED package structure 1000 includes a chip carrier 100, an LED chip 200, a Zener-diode chip 300, and an encapsulation resin 400 disposed on the chip carrier 100 and encapsulating the LED chip 200 and the Zener-diode chip 300. The LED chip 200 and the Zener-diode chip 300 are both received in the chip carrier 100. The following description discloses the construction of the chip carrier 100, and then discloses the relationship between the chip carrier 100 and the other components.

Figure 6:
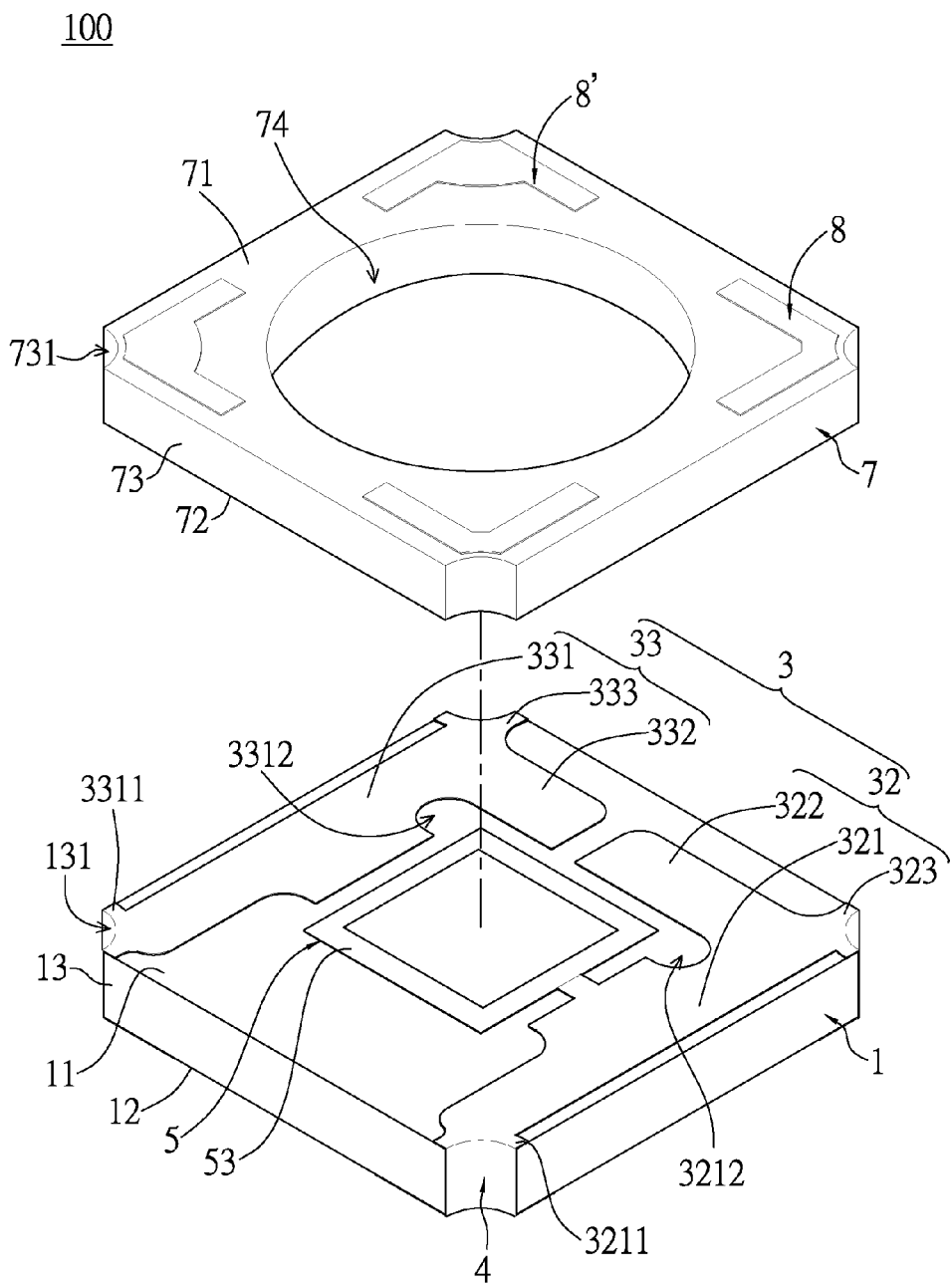
FIG. 6 is an exploded view of the chip carrier shown in FIG. 4.
Figure 7:
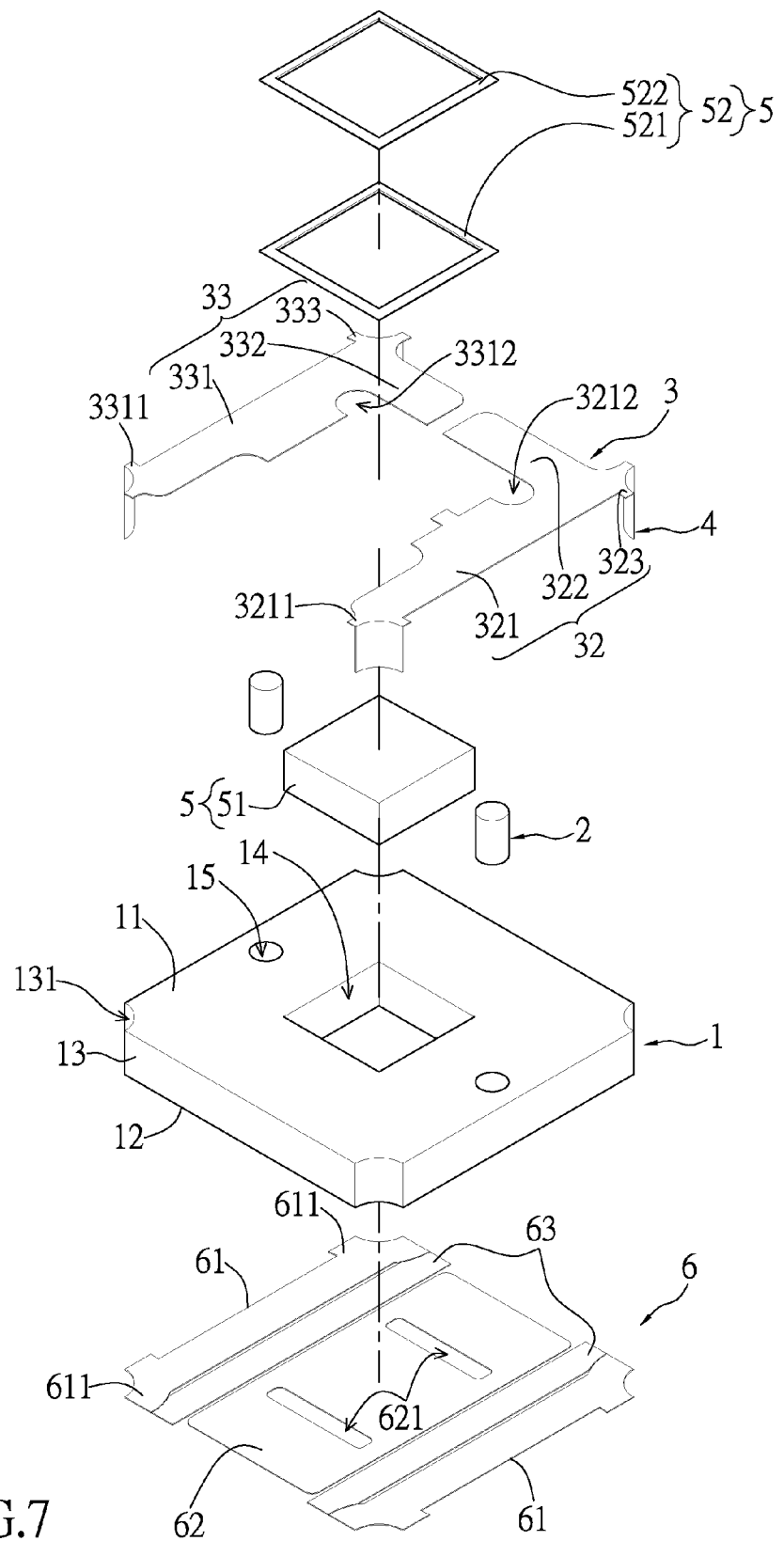
FIG. 7 is an exploded view of part of the chip carrier shown in FIG. 6.
Figure 8:
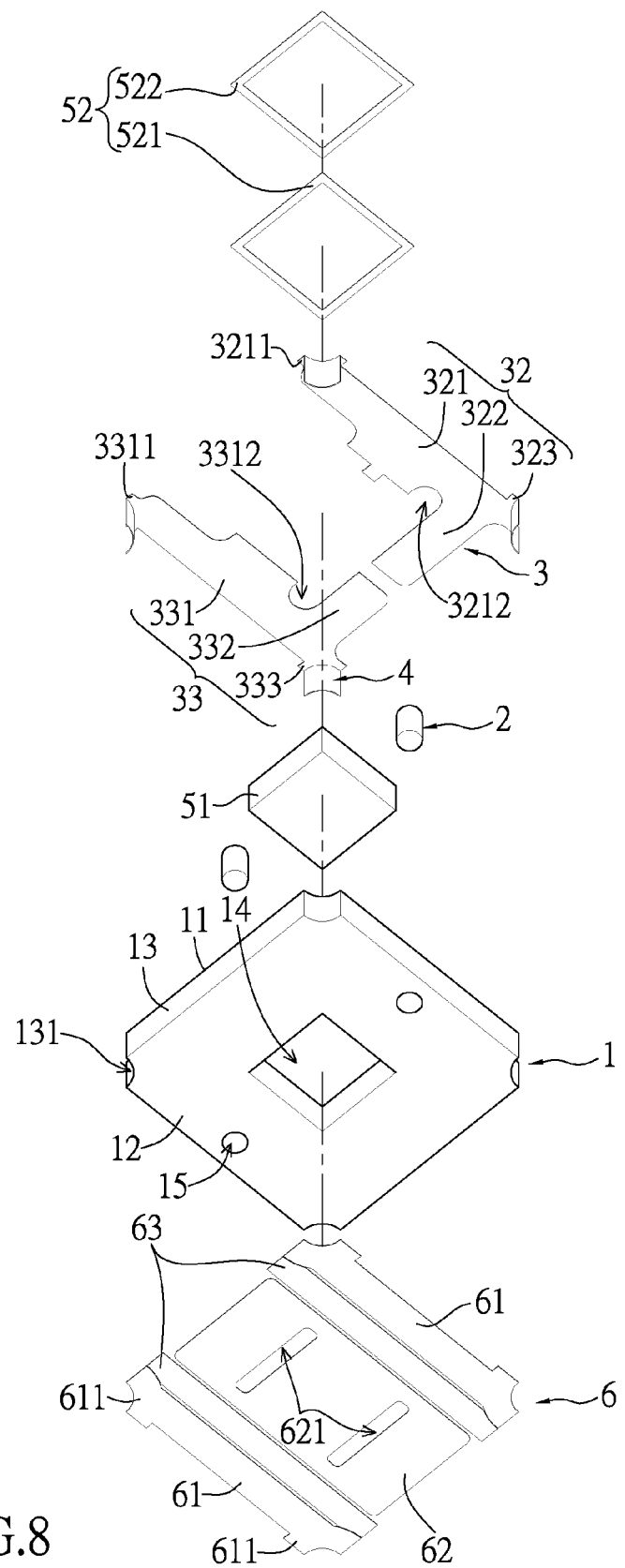
FIG. 8 is an another exploded view of FIG. 7.
Figure 9:
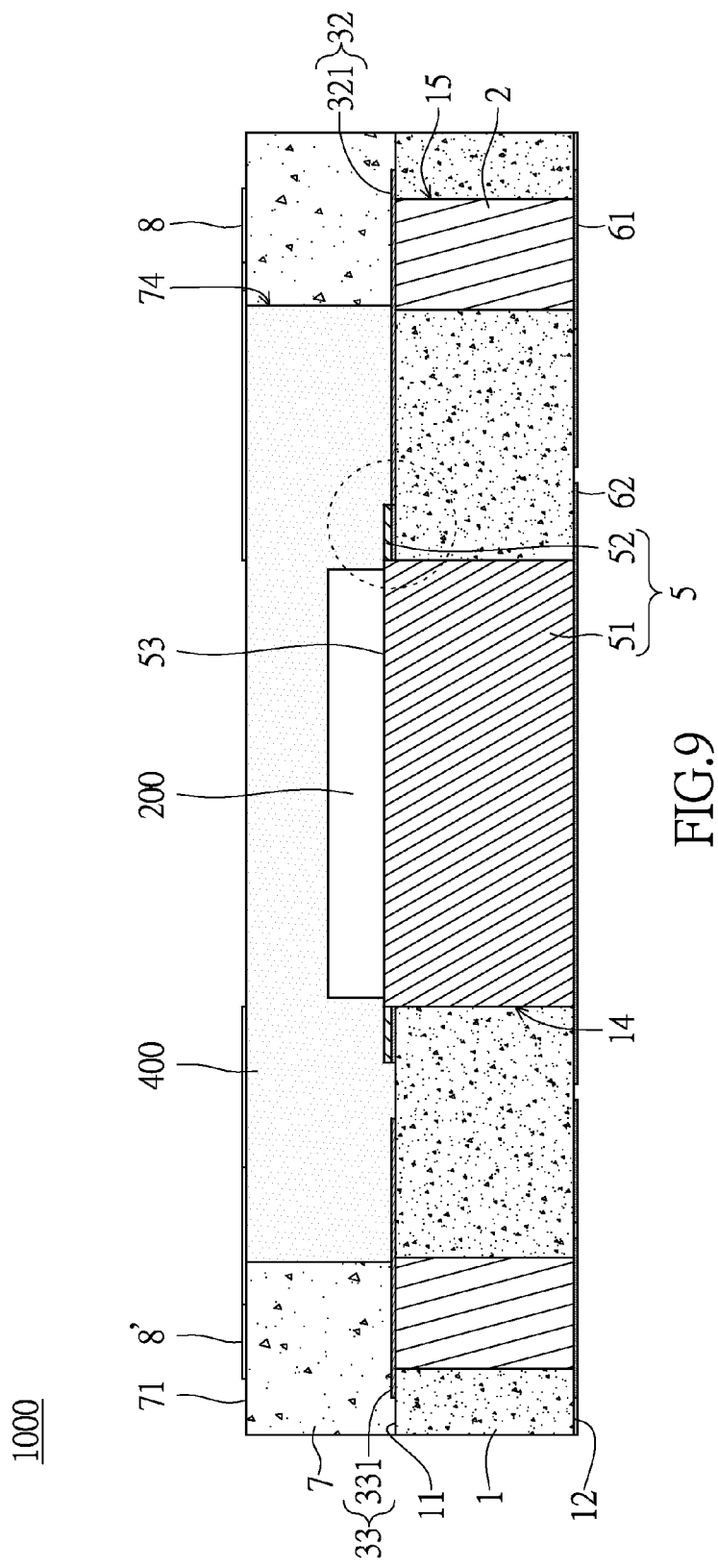
FIG. 9 is a cross-sectional view of FIG. 1 along a line X1-X1.
Figure 10:
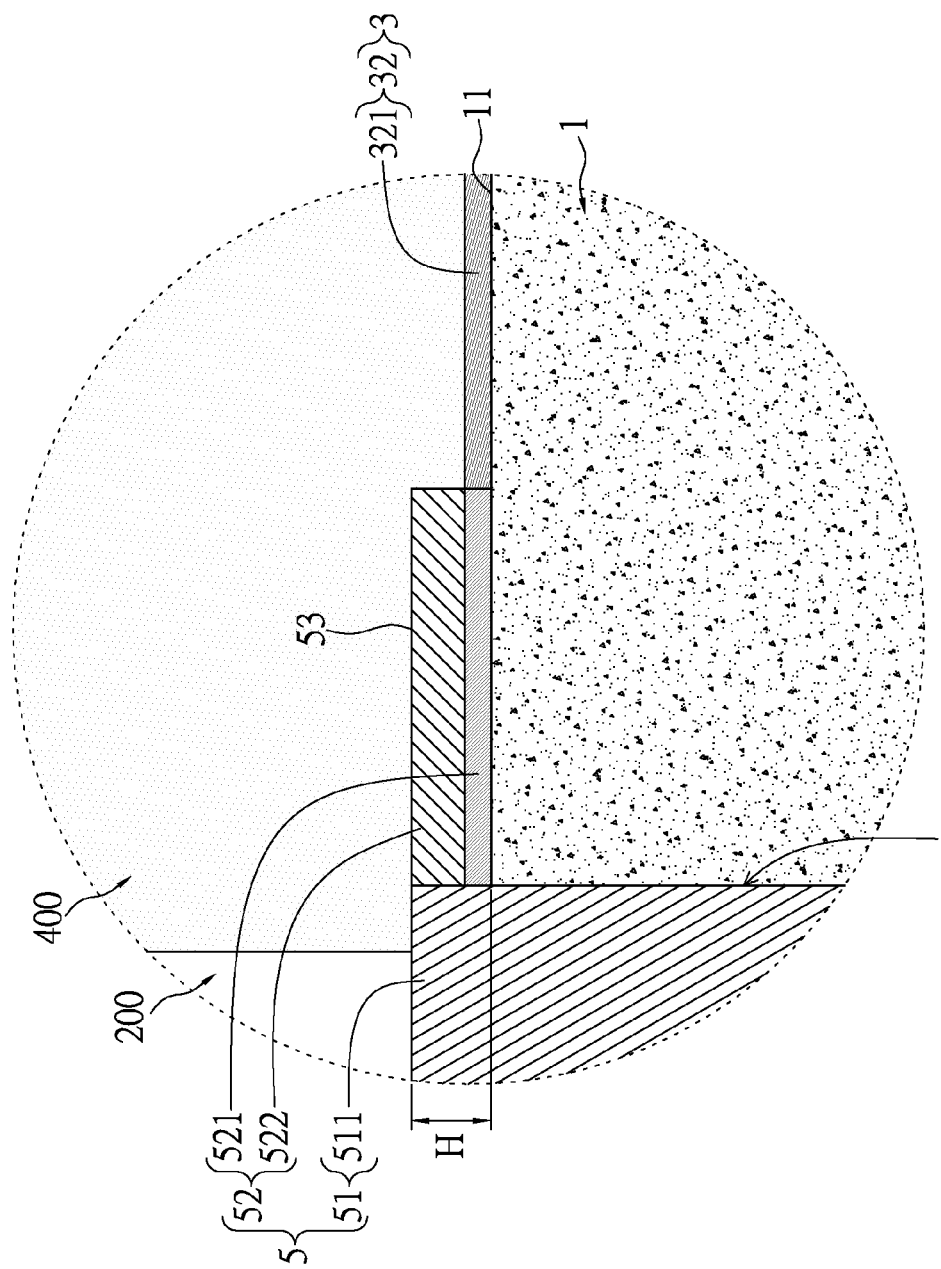
FIG. 10 is an enlarged view of FIG. 9 showing the extending portion.

Please refer to FIGS. 6 through 8, and with reference occasionally made to FIGS. 9 and 10. The chip carrier 100 includes a ceramic substrate 1, two conductive pillars 2 arranged in the ceramic substrate 1, a circuit layer 3, four extending circuits 4, a metal slug 5, a solder pad layer 6, a ceramic reflective plate 7 stacked on the ceramic substrate 1, and four polar recognition pads 8, 8' disposed on the ceramic reflective plate 7. The circuit layer 3, the extending circuits 4, the metal slug 5, and the solder pad layer 6 are disposed on the ceramic substrate 1.

The ceramic substrate 1 has a first board surface 11, a second board surface 12 opposite to the first board surface 11, and an outer side surface 13 arranged between the first and second board surfaces 11, 12. The ceramic substrate 1 has a substantially polygon shape, and the shape of the ceramic substrate 1 in the instant embodiment is a square. Each corner of the outer side surface 13 of the ceramic substrate 1 is a quarter-arc shaped notch corner 131, thereby preventing each corner of the ceramic substrate 1 from cracking.

Specifically, a center portion of the ceramic substrate 1 has an accommodating hole 14 penetrating through the first board surface 11 and the second board surface 12, and a cross-sectional shape of the accommodating hole 14 in the instant embodiment is a square having a side length of 1~1.2 mm. The ceramic substrate 1 has two thru-holes 15 penetrating through the first board surface 11 and the second board surface 12, and the two thru-holes 15 are respectively arranged at two opposite sides of the accommodating hole 14. A cross-sectional shape of each of the two thru-holes 15 in the instant embodiment is a circle.

The two conductive pillars 2 are respectively arranged in the two thru-holes 15 of the ceramic substrate 1, and each thru-hole 15 is fully filled with the corresponding conductive pillar 2. One end of each conductive pillar 2 (i.e., the top end of each conductive pillar 2 as shown in FIG. 9) is coplanar with the first board surface 11 of the ceramic substrate 1, and the other end of each conductive pillar 2 (i.e., the bottom end of each conductive pillar 2 as shown in FIG. 9) is coplanar with the second board surface 12 of the ceramic substrate 1.

The circuit layer 3 in the instant embodiment is a silver circuit layer. The circuit layer 3 is disposed on the first board surface 11 of the ceramic substrate 1, and the circuit layer 3 has a first circuit 32 and a second circuit 33. The first circuit 32 and the second circuit 33 are respectively disposed on two opposite portions of the first board surface 11 and are respectively connected to the two conductive pillars 2.

In more detail, each of the first and second circuits 32, 33 has an L shape and includes a long segment 321, 331 and a short segment 322, 332 perpendicularly connected to the corresponding long segment 321, 331. Two end portions 3211, 3311 of the long segments 321, 331, the corner segment 323 of the L-shaped first circuit 32 and the corner segment 333 of the L-shaped second circuit 33 are respectively disposed adjacent to the four notch corners 131 of the ceramic substrate 1. Specifically, each of the corner segments 323, 333 and the end portions 3211, 3311 has a quarter-arc shaped edge, which aligns with an edge of the adjacent notch corner 131. Therefore, each of the corner segments 323, 333 and the end portion 3211, 3311 are respectively formed in an arc shape.

The long segment 321 of the first circuit 32 and the long segment 331 of the second circuit 33 are parallel with each other and are respectively disposed on two opposite side portions of the first board surface 11 to cover the two thru-holes 15, so that the two conductive pillars 2 are respectively connected to the long segment 321 of the first circuit 32 and the long segment 331 of the second circuit 33 (as shown in FIG. 9). The short segment 322 of the first circuit 32 and the short segment 332 of the second circuit 33 are disposed on one side portion of the first board surface 11 and face with each other. More specifically, the short segment 322 of the first circuit 32 and the short segment 332 of the second circuit 33 are disposed between the two long segments 321, 331 of the first and second circuit 32, 33.

Moreover, an inner edge of each of the long segments 321, 322 has a half circle-shaped notch 3212, 3312 concavely formed on a portion thereof connected to the corresponding short segment 322, 332. In other words, the half circle-shaped notches 3212, 3312 are respectively formed on the inner corners of the L-shaped first circuit 32 and the L-shaped second circuit 33.

The extending circuits 4 are respectively formed on the notch corners 131 of the outer side surface 13 of the ceramic substrate 1. The four extending circuits 4 are respectively and perpendicularly connected to the two end portions 3211, 3311 of the long segments 321, 331 and the two corner segments 323, 333.

The metal slug 5 in the instant embodiment is a silver slug, and the metal slug 5 includes a main portion 51 and an extending portion 52. The main portion 51 is arranged in the accommodating hole 14, and the accommodating hole 14 is fully filled with the main portion 51. A cross-sectional shape of the main portion 51 in the instant embodiment is a square having side length of 1~1.2 mm, but the cross-sectional shape of the main portion 51 is not limited thereto. For example, the cross-sectional shape of the main portion 51 can be rectangular or circular. One end of the main portion 51 (i.e., the bottom end of the main portion 51 as shown in FIG. 9) is substantially coplanar with the second board surface 12 of the ceramic substrate 1, and the other end of the main portion 51 (i.e., the top end of the main portion 51 as shown in FIG. 9) protrudes from the first board surface 11 of the ceramic substrate 1 with a height of 10~30 µm. Part of the main portion 51 protruding from the first board surface 11 is defined as a protrusion block 511 (as shown in FIG. 10). In other words, a height H of the protrusion block 511 protruding from the first board surface 11 is about 10~30 µm.

The metal slug 5 is formed by a screen printing, such as filling a metal gel (e.g., gel mixed with metal powder, such as silver gel) into the accommodating hole 14. If the amount of the gel mixed with metal powder is substantially identical to the volume of the accommodating hole (not shown), a metal slug sintered from the gel mixed with metal powder cannot protrude from the accommodating hole and a top surface of the metal slug is formed as a concave surface because of the cohesion force of the gel mixed with metal powder, such that the concave surface of the metal slug will influence the mounting process of the LED chip. However, the chip carrier 100 of the instant embodiment is provided with the main portion 51 of the metal slug 5 protruding from the accommodating hole 14, thereby avoiding generating a curved mounting surface, such as the mounting surface is concave.

The extending portion 52 is integrally connected to an outer edge of the protrusion block 511 (as shown in FIG. 10), and the extending portion 52 in the instant embodiment having a square-ring shape surrounds the protrusion block 511 of the main portion 51. The extending portion 52 is disposed on the first board surface 11 of the ceramic substrate 1, a top surface of the extending portion 52 and a top surface of the protrusion block 511 are coplanar and are defined as a mounting surface 53 having a square shape. In regard to the top surfaces of the ceramic substrate 1 and the metal slug 5, an area of the mounting surface 53 is 5~15% (i.e., 8.5%) of an area of the top surfaces of the ceramic substrate 1 and the metal slug 5. Moreover, the long segment 321 of the first circuit 32 and the long segment 331 of the second circuit 33 are respectively arranged at two opposite sides of the mounting surface 53, and the short segment 322 of the first circuit 32 and the short segment 332 of the second circuit 33 are arranged at one side of the mounting surface 53.

Specifically, the extending portion 52 includes a first extending portion 521 and a second extending portion 522 disposed on the first extending portion 521. Each one of the first extending portion 521 and the second extending portion 522 has a square ring shape having side length of 50~100 μm and surrounds the accommodating hole 14. In other words, an inner edge of the first extending portion 521 is aligned with an inner edge of the second extending portion 522 and aligned with the accommodating hole 14. The first and second extending portions 521, 522 surround and seamlessly connect the outer edge of the protrusion block 511 of the main portion 51. Moreover, the first extending portion 521 is connected to the long segment 321 of the first circuit 32, and the first extending portion 521 is coplanar with the first and second circuits 32, 33 of the circuit layer 3. The second circuit 33 is separated from the extending portion 52 and the first circuit 31.

Accordingly, the metal slug 5 can be physically connected to the first circuit 32 for establishing an electrical connection between the extending portion 52 of the metal slug 5 and the first circuit 32, such that the mounting surface 53 of the metal slug 5 can be provided for an LED chip 200 either LED chip 200 having a horizontal structure or LED chip 200 having a vertical structure (the specific implementing manner will be disclosed in the following description). The metal slug 5 is provided with the extending portion 51 to effectively increase a mounting area of the mounting surface of the metal slug 5, thereby allowing the LED chips 200 to be applied with different sizes.

The solder pad layer 6 is disposed on the second board surface 12 of the ceramic substrate 1. The solder pad layer 6 includes two elongated electrically-conductive pads 61 and an elongated thermally-conductive pad 62 arranged between the electrically-conductive pads 61. A longitudinal direction of the thermally-conductive pad 62 is parallel to a longitudinal direction of each of the electrically-conductive pads 61, and the thermally-conductive pad 62 and each of the electrically-conductive pads 61 are spaced apart from each other with a predetermined distance. The two electrically-conductive pads 61 are substantially and respectively arranged under the two long segments 321, 331 of the circuit layer 3. Each end portion 611 of each electrically-conductive pad 61 has a quarter-arc shaped edge, and the edges of the end portions 611 respectively align with the edges of the notch corners 131. The extending circuits 4 arranged on the notch corners 131 are respectively connected to the end portions 611 of the electrically-conductive pads 61 of the solder pad layer 6. In other embodiment, the extending circuits 4 arranged on the notch corners 131 also can be separated from the end portions 611 of the electrically-conductive pads 61 of the solder pad layer 6.

Thus, when the electrically-conductive pads 61 and the thermally-conductive pad 62 are in a soldering process, a solder climbs along the corresponding extending circuit 4 by the means of the cohesiveness thereof, thereby effectively increasing the soldering area of the chip carrier 100.

Moreover, the two electrically-conductive pads 61 are disposed on the second board surface 12 to respectively cover the two thru-holes 15 (as shown in FIG. 9), and the two conductive pillars 2 are respectively connected to the two electrically-conductive pads 61, such that the two electrically-conductive pads 61 are electrically connected to the first and second circuits 31, 32 by the two conductive pillars 2.

In addition, the thermally-conductive pad 62 is connected to the main portion 51 of the metal slug 5. Specifically, the size of the thermally-conductive pad 62, such as a length and a width, is greater than the size of the square cross-section of the main portion 51, such that the bottom surface of the main portion 51 can be entirely connected to the thermally-conductive pad 62. The thermally-conductive pad 62 has a connecting region connected to the main portion 51. The thermally-conductive pad 62 has two openings 621 respectively arranged on two opposite portions of the connecting region thereof, thereby preventing the thermally-conductive pad 62 from bending.

Additionally, an isolation pad 63 (e.g., black glass-gel) can be arranged between the thermally-conductive pad 62 and each of the electrically-conductive pads 61, such that each of the electrically-conductive pads 61 is electrically isolated from the thermally-conductive pad 62 by arranging the isolation pad 63 (i.e., the glass-gel).

As shown in FIGS. 6 and 9, the ceramic reflective plate 7 has a first surface 71, a second surface 72 opposite to the first surface 71, and a lateral surface 73 arranged between the first and second surfaces 71, 72. The ceramic reflective plate 7 has a substantially polygon shape, and the shape of the ceramic reflective plate 7 in the instant embodiment is a square. Each corner of the lateral surface 73 of the ceramic reflective plate 7 is a quarter-arc shaped notch corner 731, thereby a crack on each corner of the ceramic reflective plate 7 can be avoided. Moreover, a center portion of the ceramic reflective plate 7 has a circular penetrating hole 74 penetrating through the first surface 71 and the second surface 72, and a diameter of the penetrating hole 74 is greater than a diagonal of the mounting surface 53. The penetrating hole 74 in the instant embodiment is circle, but it is not limited thereto. For example, the penetrating hole 74 can have a square shape.

The second surface 72 of the ceramic reflective plate 7 is disposed on the first board surface 11 of the ceramic substrate 1, the ceramic reflective plate 7 covers part of the circuit layer 3, and the lateral surface 73 of the ceramic reflective plate 7 is aligned with the outer side surface 13 of the ceramic substrate 1. A portion of the circuit layer 3, which is not covered by the ceramic reflective plate 7, includes part of each long segment 321, 331 and part of each short segment 322, 332, which are arranged adjacent to the extending portion 52.

As shown in FIG. 5, the part of the long segment 321, which is not covered by the ceramic reflective plate 7, is defined as a first wiring portion 3213. The part of the long segment 331, which is not covered by the ceramic reflective plate 7, is defined as a second wiring portion 3313. The part of the short segment 322, which is not covered by the ceramic reflective plate 7, is defined as a Zener-diode mounting portion 3221. The part of the short segment 332, which is not covered by the ceramic reflective plate 7, is defined as a Zener-diode wire-bonding portion 3321. The mounting surface 53 of the metal slug 5, the first wiring portion 3213, the second wiring portion 3313, the Zener-diode mounting portion 3221, the Zener-diode wire-bonding portion 3321, and the notches 3212, 3312 of the first and second circuits 32, 33 are exposed from the ceramic reflective plate 7 via the penetrating hole 74.

A light reflectivity of ceramic is greater than that of silver according to light with the same wavelength, so the light reflectivity of the ceramic substrate 1 is greater than that of the silver circuit layer 3. Thus, the first circuit 32 and the second circuit 33 are provided with the notches 3212, 3312 to expose more area of the first board surface 11 of the ceramic substrate 1 from the ceramic reflective plate 7 via the penetrating hole 74, such that the light efficiency of the LED package structure 1000 can be effectively increased.

As shown in FIGS. 5 and 6, each of the polar recognition pads 8, 8' has a thickness of 10~20 μm, and the each of the polar recognition pads 8, 8' can be a black glass-gel pad or a metal pad. The polar recognition pads 8, 8' are respectively disposed on four corners of the first surface 71 of the ceramic reflective plate 7, and an inner edge of the corner of each of the polar recognition pads 8, 8' faces toward the penetrating hole 74 of the ceramic reflective plate 7. Specifically, each one of the polar recognition pads 8, 8' has a substantially L shape, and the shape of the polar recognition pads 8 and the shape of the polar recognition pads 8' are different. An inner edge of the corner of each of the polar recognition pads 8 is a right angle, and the two polar recognition pads 8 are respectively disposed above the first circuits 32. An inner edge of the corner of each polar recognition pad 8' is an arc, and the two polar recognition pads 8' are respectively disposed above the second circuits 33.

Accordingly, the polar recognition pads 8, 8' provide a polar recognition function for the LED package structure 1000 by respectively arranging the two different shapes of the polar recognition pads 8, 8' above the first and second circuits 32, 33.

The construction of the chip carrier 100 of the instant embodiment has been disclosed in the above description, and the following description discloses the relationship of the chip carrier 100, the LED chip 200, the Zener diode chip 300, and the encapsulation resin 400.

As shown in FIGS. 3 through 5, the LED chip 200 in the instant embodiment is a horizontal chip, but the LED chip 200 is not limited thereto. For example, the LED chip 200 can be a vertical chip. Specifically, the LED chip 200 in the instant embodiment is a horizontal chip for emitting light having a wavelength of 255~410 nm, such as a UVA LED chip (wavelength of 315~400 nm), a UVB LED chip (wavelength of 280~315 nm), or a UVC LED chip (wavelength of 100~280 nm).

The LED chip 200 is mounted on the mounting surface 53 of the chip carrier 100 and is electrically connected to the circuit layer 3. Specifically, when the LED chip 200 is a horizontal chip (as shown in FIG. 3), the chip electrodes arranged on the top surface of the LED chip 200 and having two opposite polarities are respectively and electrically connected to the first wiring portion 3213 of the first circuit 32 and the second wiring portion 3313 of the second circuit 33 by wire bonding. When the LED chip 200 is a vertical chip (not shown), the chip electrode arranged on the bottom surface of the LED chip 200 is electrically connected to the first circuit 32 by the metal slug 5, and the chip electrode arranged on the top surface of the LED chip 200 is electrically connected to the second wiring portion 3313 of the second circuit 33 by wire bonding.

In addition, the LED package structure 1000 can further comprise an adhesive (not shown), and the LED chip 200 can be bonded on the mounting surface 53 of the chip carrier 100 by using the adhesive. In the instant embodiment, the adhesive is a nano-silver paste, the nano-silver paste is made of nano-silver powders without epoxy resin, and a volume percentage of the nano-silver powders of the nano-silver paste is about 85~90%, thereby the adhesive has good thermal resistance and a degradation problem does not easily occur. Moreover, when the nano-silver powders have particle size smaller than 20 nm, the nano-silver powders having a weight percentage of 20~35% are provided for the nano-silver paste. When the nano-silver powders having particle size of 20~100 nm, the nano-silver powers having a weight percentage of 40~50% are provided for the nano-silver paste. A binder being Isobornyl Cyclohexanol (IBCH) is provided with a weight percentage of 2~7%; a solution being 1-decanol is provided with a weight percentage of 5~15%. The chemical formula of the nano-silver paste is $nAg-m(AgOOCR-l(AgOR), R=[CH_3(CH_2)x]$, and l, m, n, x are positive integers.

The Zener diode chip 300 is mounted on part of the short segment 322 of the first circuit 32 exposed from the ceramic reflective plate 7 via the penetrating hole 74. That is to say, the Zener diode chip 300 is mounted on and electrically connected to the Zener diode mounting portion 3221 of the first circuit 32. The Zener diode chip 300 is electrically connected to the Zener diode wiring portion 3321 of the second circuit 33 by wire bonding.

As shown in FIGS. 3 and 9, the encapsulation resin 400 in the instant embodiment is a condensation-type silicone resin, and the condensation-type silicone resin means that each main chain is a Si—O junction having bonding energy of 452 kj/mol. The encapsulation resin 400 is arranged in the penetrating hole 74 of the ceramic reflective plate 7. Specifically, the penetrating hole 74 of the ceramic reflective plate 7 is fully filled with the encapsulation resin 400, and the LED chip 200 and the Zener diode chip 300 are embedded in the encapsulation resin 400. The top surface of the encapsulation resin 400 is substantially coplanar with the first surface 71 of the ceramic reflective plate 7.

Figure 11:
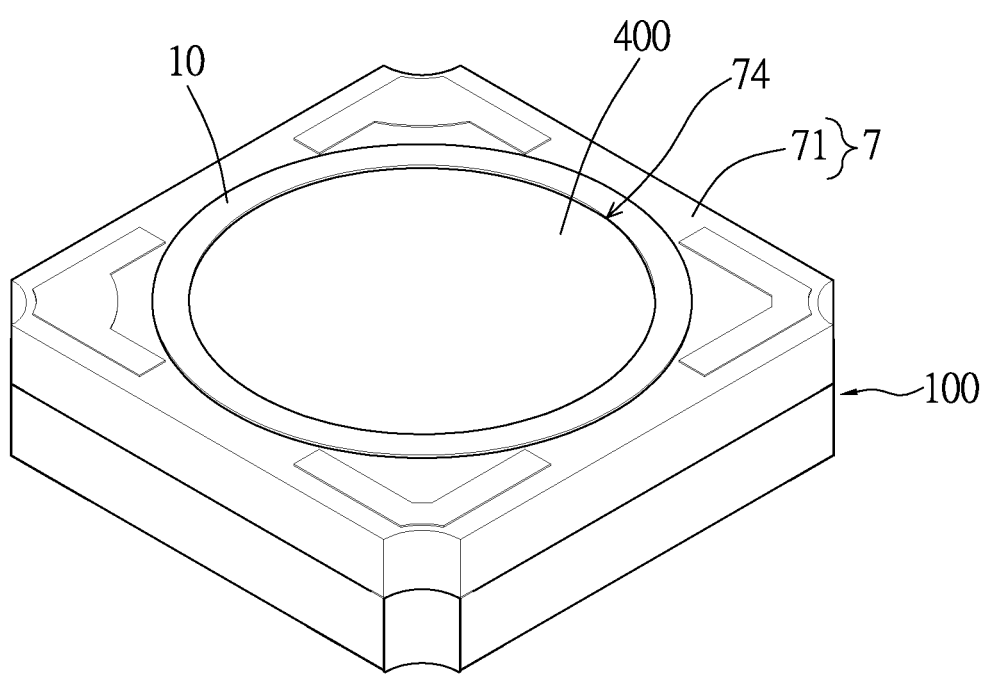
FIG. 11 is a perspective view showing the LED package structure shown in FIG. 1 provided with an annular blocking layer.

In addition, the chip carrier 100 of the instant embodiment can further comprise an annular blocking layer 10 (as shown in FIG. 11), and the material of the annular blocking layer 10 in the instant embodiment is transparent glass-gel. The annular blocking layer 10 is disposed on the first surface 71 of the ceramic reflective plate 7 and surrounds the penetrating hole 74 of the ceramic reflective plate 7 for preventing the encapsulation resin 400 from outwardly flowing in a molding process.

[Second Embodiment]

Please refer to the FIGS. 12 through 17, which show a second embodiment of the instant disclosure. The second embodiment is similar to the first embodiment, so the same features are not disclosed again. The main different feature of the two embodiments is that the LED package structure 1000 of the instant embodiment further comprises a cover 500 and the encapsulation resin 400 is not included therein, and this different feature is disclosed as follows.

Figure 12:
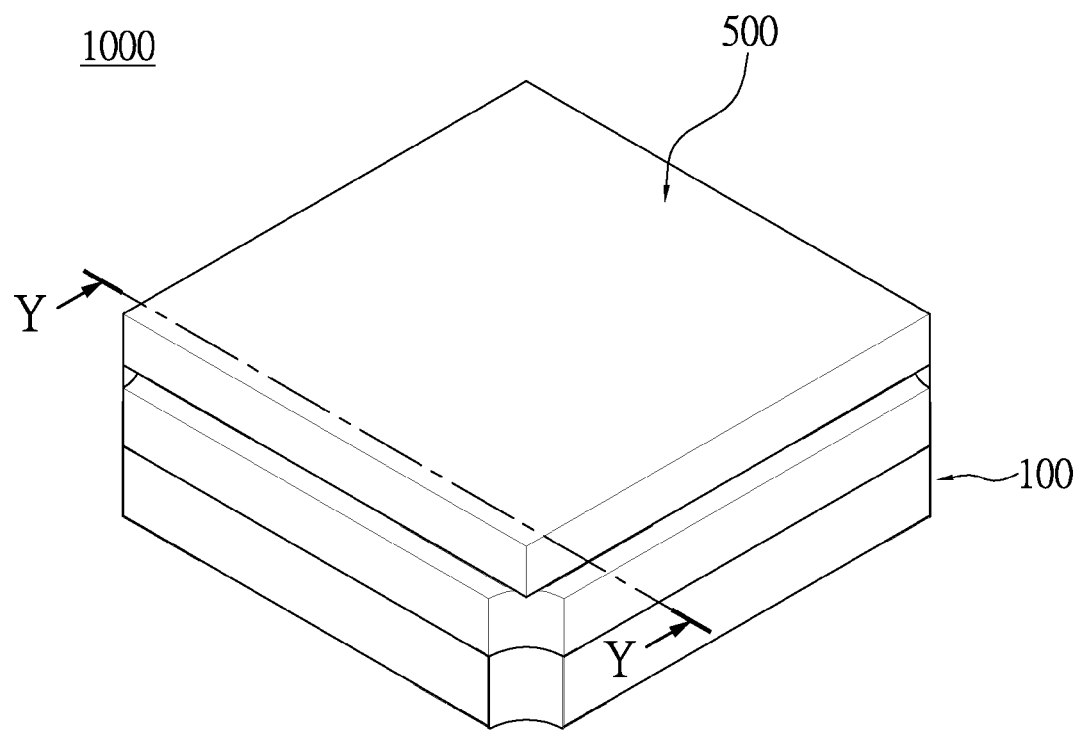
FIG. 12 is a perspective view showing an LED package structure according to a second embodiment of the instant disclosure.
Figure 13:
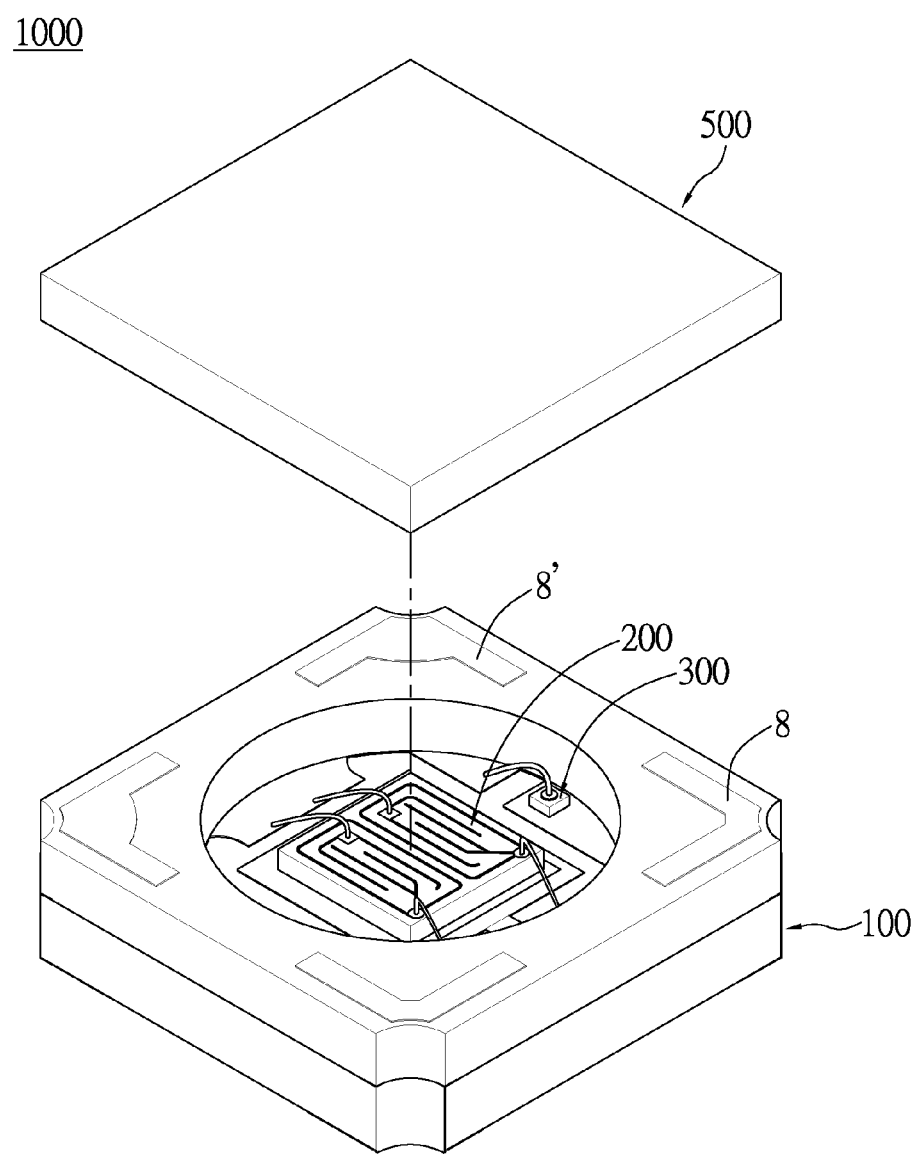
FIG. 13 is an exploded view of FIG. 12.
Figure 14:
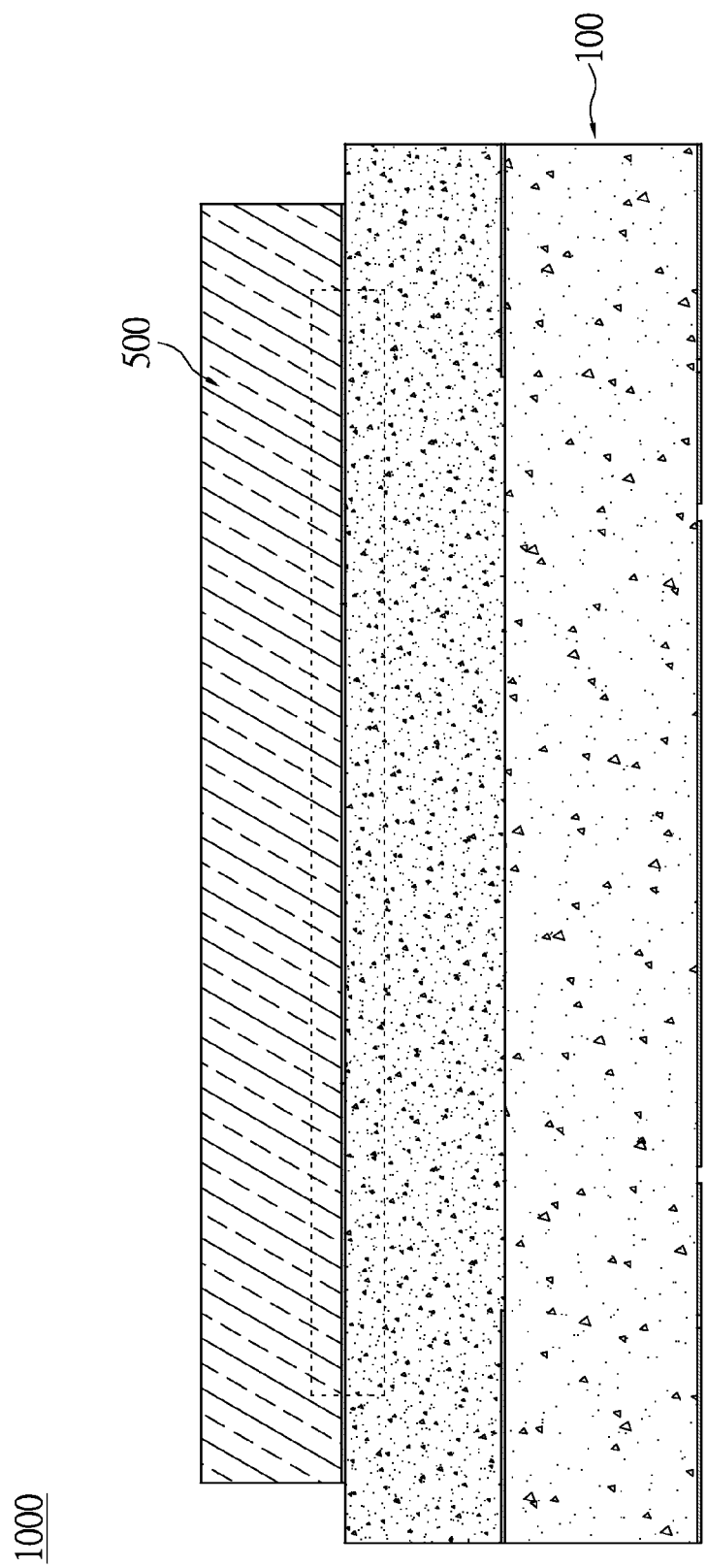
FIG. 14 is a cross-sectional view of FIG. 12 along a line Y-Y.
Figure 15:
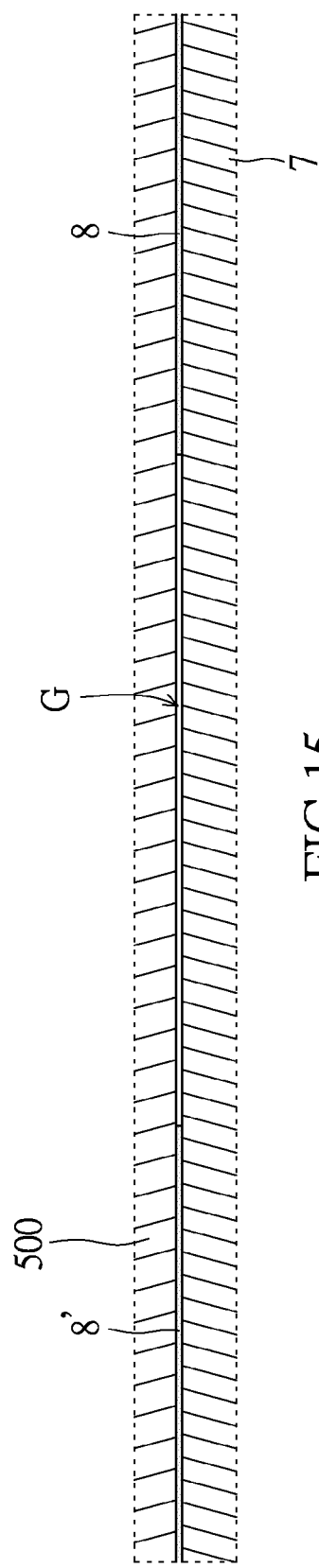
FIG. 15 is an enlarged view of FIG. 14 showing the glass-gel pads and the plurality of gaps.

As shown in FIGS. 12 and 13, the cover 500 is adhered to the ceramic reflective plate 7 of the chip carrier 100 by the glass-gel pads 8, 8', and the glass-gel pads 8, 8' are arranged to form a plurality of gaps G (as shown in FIGS. 14 and 15) existed between the cover 500 and the first surface 71 of ceramic reflective plate 7, thereby air in the penetrating hole 74 of the chip carrier 100 can be communicated with external air.

The cover 500 can be an optical lens, and the cover 500 in the instant embodiment is a flat plate, but the cover 500 is not limited thereto. For example, a coating layer (not shown) can be formed on the cover 500 to increase light transmittance of the cover 500. In other embodiment, the cover 500 can be formed as a half-sphere construction to adjust the light path. For example, when the LED package structure 1000 adopts the UVA LED chip 200, a planar cover 500 is adopted, and the material of the cover 500 is glass or quartz; when the LED package structure 1000 adopts the UVA LED chip 200 or the UVC LED chip 200, a planar cover 500 is adopted and two opposite surfaces of the cover 500 are respectively coated with two coating layers, and the material of the cover 500 is glass or quartz; when the LED package structure 1000 adopts the UVC LED chip 200, the cover 500 is a half-sphere lens, the material of the cover 500 is glass or quartz, and a coating layer can coat on the surface of the lens or not.

Figure 16A:
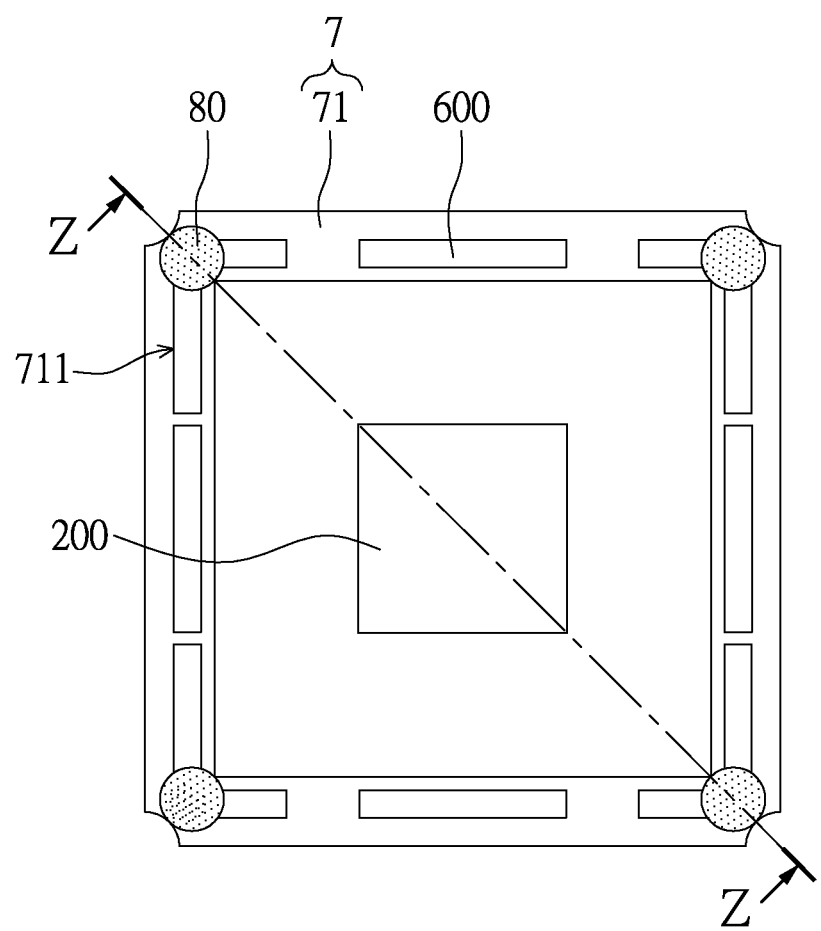
FIG. 16A is a perspective view showing the LED package structure of the second embodiment in another way.
Figure 16B:
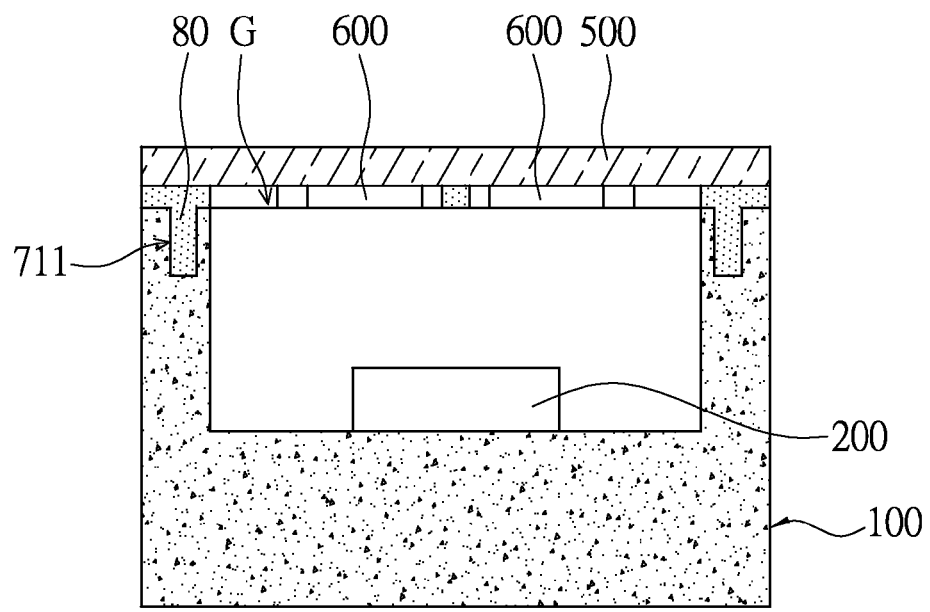
FIG. 16B is a cross-sectional view of FIG. 16A along a line Z-Z.
Figure 16C:
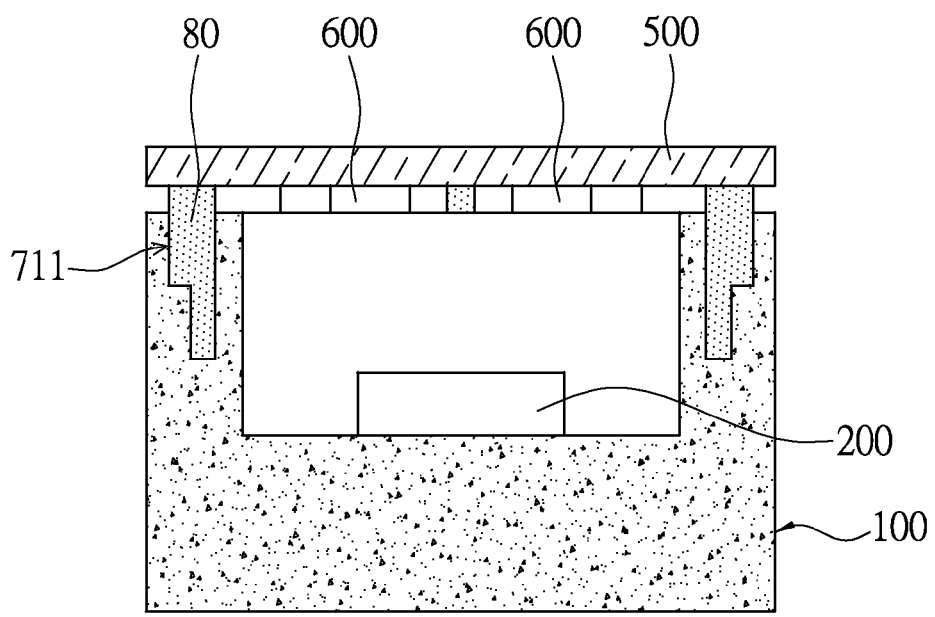
FIG. 16C is a cross-sectional view of FIG. 16A along the line Z-Z in another way.

In addition, the LED package structure 1000 of the instant embodiment can be implemented by a different embodiment. Please refer to FIGS. 16A through 16C, which show the glass-gel pads 8, 8' replaced by adhesives 80 (i.e., UV adhesive). The ceramic reflective plate 7 has a plurality of gel slots 711 concavely formed on the first surface 71 thereof The adhesives 80 are respectively filled in the gel slots 711, and at least part of each adhesive 80 protrudes from the respective gel slot 711. The LED package structure 1000 further comprises a plurality of spacers 600. Each of the spacers 600 is protruding from the first surface 71 of the ceramic reflective plate 7 and arranged between two adjacent gel slots 711. The plurality of spacers 600 are sandwiched between the first surface 71 of the ceramic reflective plate 7 and the cover 500. Accordingly, the gaps G existed between the first surface 71 of the ceramic reflective plate 7 and the bottom surface of the cover 500 can be controlled to a predetermined interval. Moreover, each of the gel slots 711 can be formed as a single layer construction as shown in FIG. 16B or dual layer construction as shown in FIG. 16C (i.e., the gel slot 711 has a step construction), but the construction of the gel slot 711 is not limited thereto.

Figure 17:
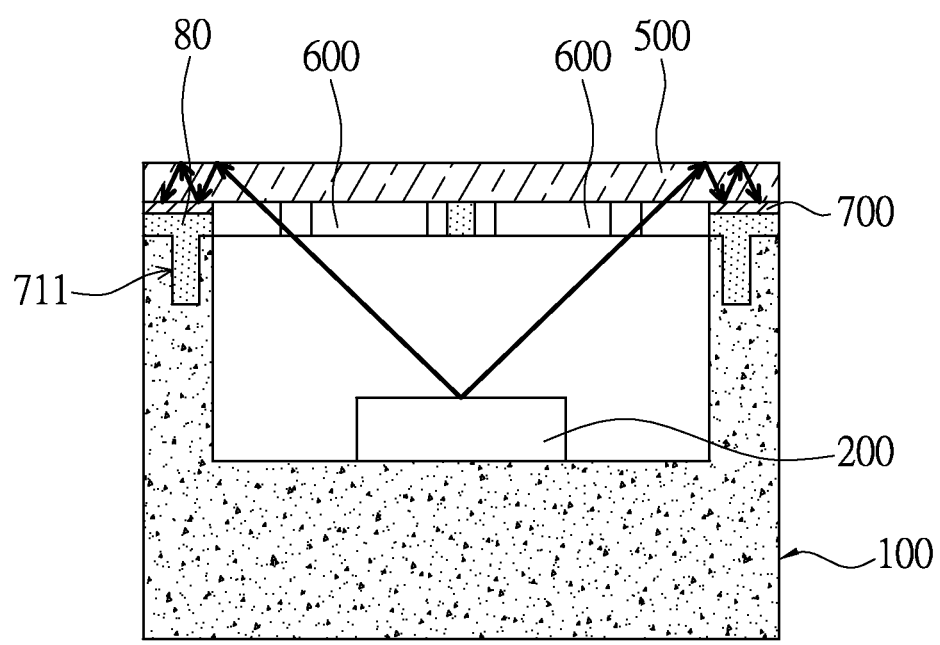
FIG. 17 is a perspective view showing the LED package structure of the second embodiment in still another way.
Figure 18:
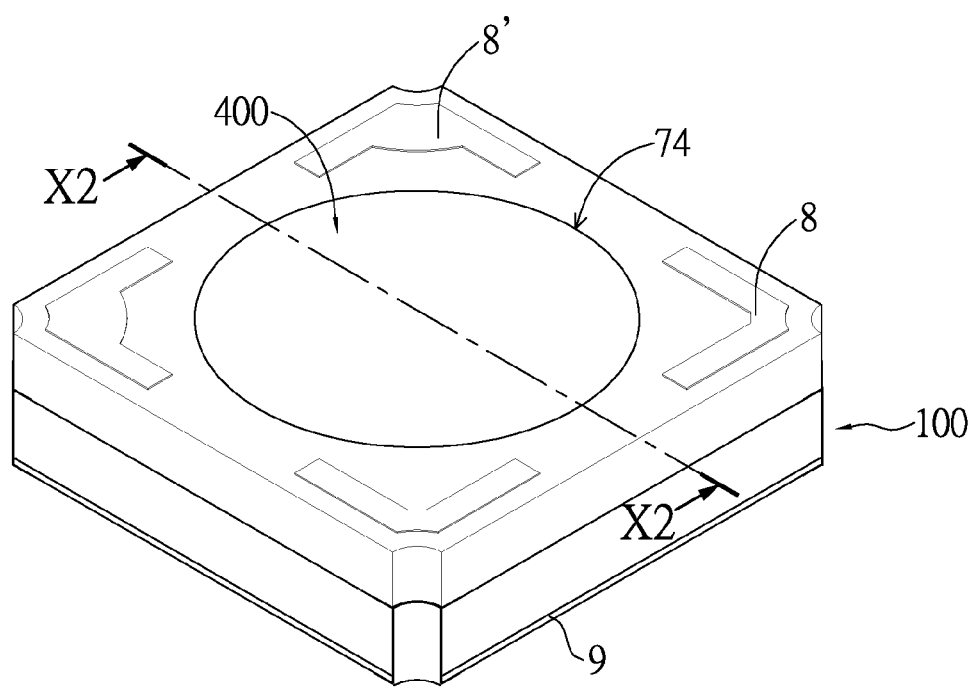
FIG. 18 is a perspective view showing an LED package structure according to a third embodiment of the instant disclosure.
Figure 19:
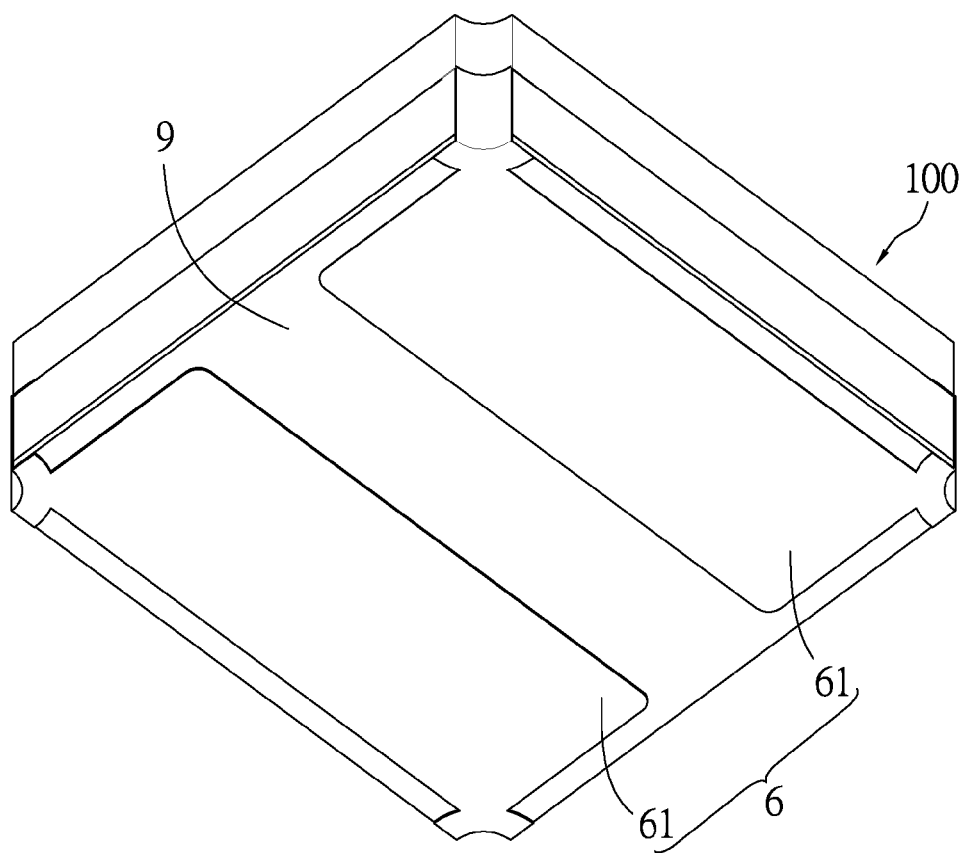
FIG. 19 is an another perspective view of FIG. 18.
Figure 20:
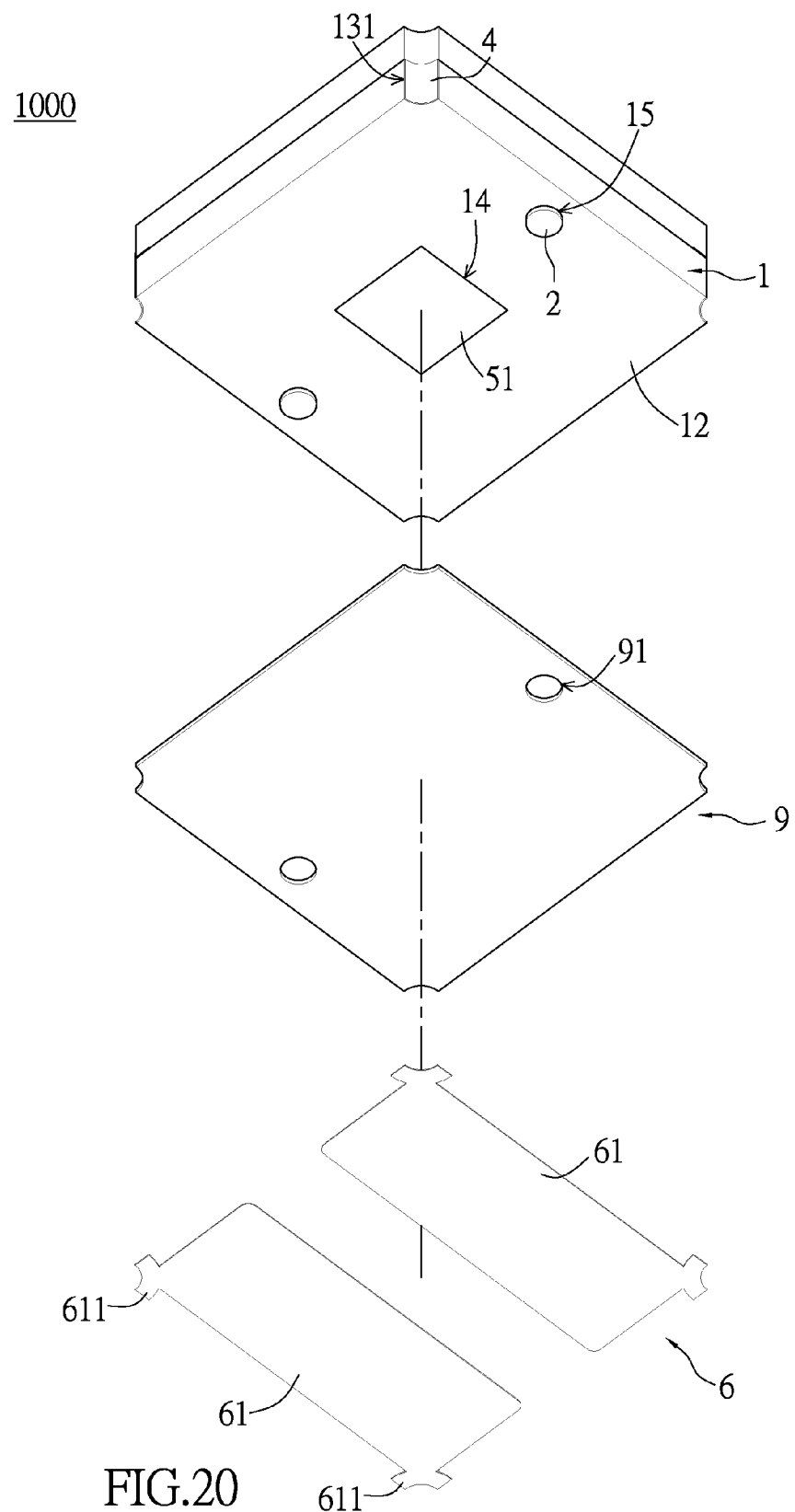
FIG. 20 is an exploded view of FIG. 19.

The LED package structure 1000 of the instant embodiment can be implemented by another embodiment as shown in FIG. 17. Specifically, when the LED chip 200 arranged in the LED package structure 1000 is an UV LED chip 200, the LED package structure 1000 further comprises a reflective film 700 having a square ring shape. The reflective film 700 is disposed under the cover 500 and is corresponding to the position of the adhesives 80 (e.g., the position of the gel slots 711), and the reflective film 700 can be provided on the cover 500 by coating. Thus, when UV light emitted from the UV LED chip 200 travels in the cover 500, the adhesives 80 can effectively be shielded by the reflective film 700 for preventing the adhesives 80 from degradation. The adhesives 80 are usually degraded due to UV light.

[Third Embodiment]

Please refer to the FIGS. 18 through 21, which show a third embodiment of the instant disclosure. The third embodiment is similar to the first embodiment, so the same features are not disclosed again. A main different feature of the two embodiments is that the LED package structure 1000 of the instant embodiment further comprises a ceramic interlayer 9 and the solder pad layer 6 of the instant embodiment is different from that of the first embodiment, and the different features are disclosed as follows.

A thickness of the ceramic interlayer 9 is about 50~100 μm, and the ceramic interlayer 9 is arranged between the second board surface 12 of the ceramic substrate 1 and the solder pad layer 6. The ceramic interlayer 9 has two thru-holes 91 respectively corresponding to the thru-holes 15 of the ceramic substrate 1, and the two conductive pillars 2 arranged in the thru-holes 15 of the ceramic substrate 1 respectively couple through the two thru-holes 91 of the ceramic interlayer 9. The main portion 51 of the metal slug 5 is connected to the ceramic interlayer 9.

Figure 21:
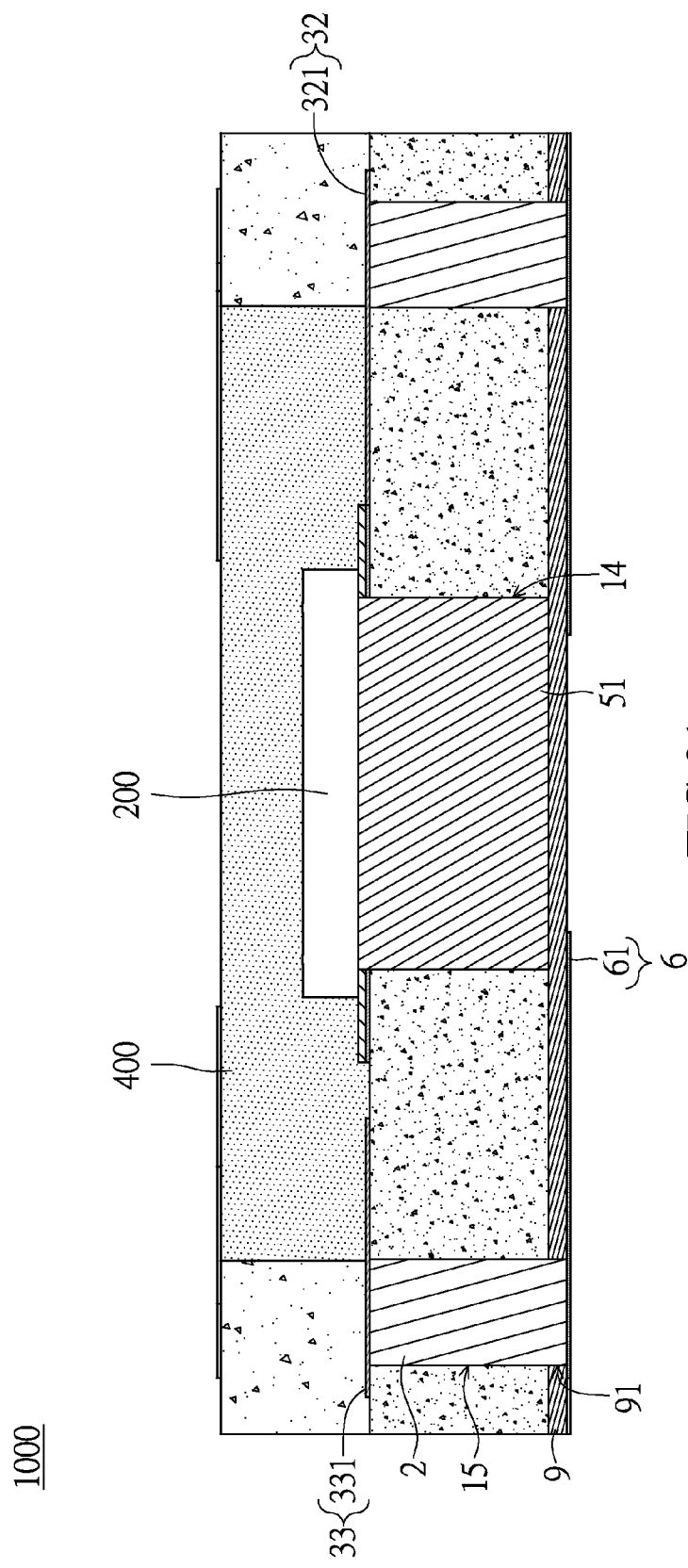
FIG. 21 is a cross-sectional view of FIG. 18 along a line X2-X2.

The solder pad layer 6 is disposed under the ceramic interlayer 9 and includes two elongated electrically-conductive pads 61 arranged apart from each other. The longitudinal directions of the two electrically-conductive pads 61 are parallel with each other. The two electrically-conductive pads 61 are substantially and respectively arranged under the two long segments 321, 331 (as shown in FIG. 21). Each of the end portions 611 of the electrically-conductive pads 61 has a quarter-arc shaped edge, which aligns with an edge of the adjacent notch corner 131. The extending circuits 4 arranged on the notch corners 131 are respectively connected to the end portions 611 of the electrically-conductive pads 61. In other embodiment, the extending circuit 4 arranged on the notch corners 131 also can be respectively separated from the end portion 611 of the electrically-conductive pads 61.

Thus, when the extending circuits 4 arranged on the notch corners 131 are respectively connected to the end portions 611 of the electrically-conductive pads 61, the solder climbs along the corresponding extending circuits 4 by means of the cohesiveness thereof, thereby effectively increasing the soldering area of the chip carrier 100.

Moreover, the two electrically-conductive pads 61 respectively cover the two thru-holes 91 of the ceramic interlayer 9, and the two conductive pillars 2 are respectively connected to the two electrically-conductive pads 61, thereby respectively and electrically connecting the two electrically-conductive pads 61 to the first circuit 32 and the second circuit 33 by the two conductive pillars 2.

[Fourth Embodiment]

Figure 22:
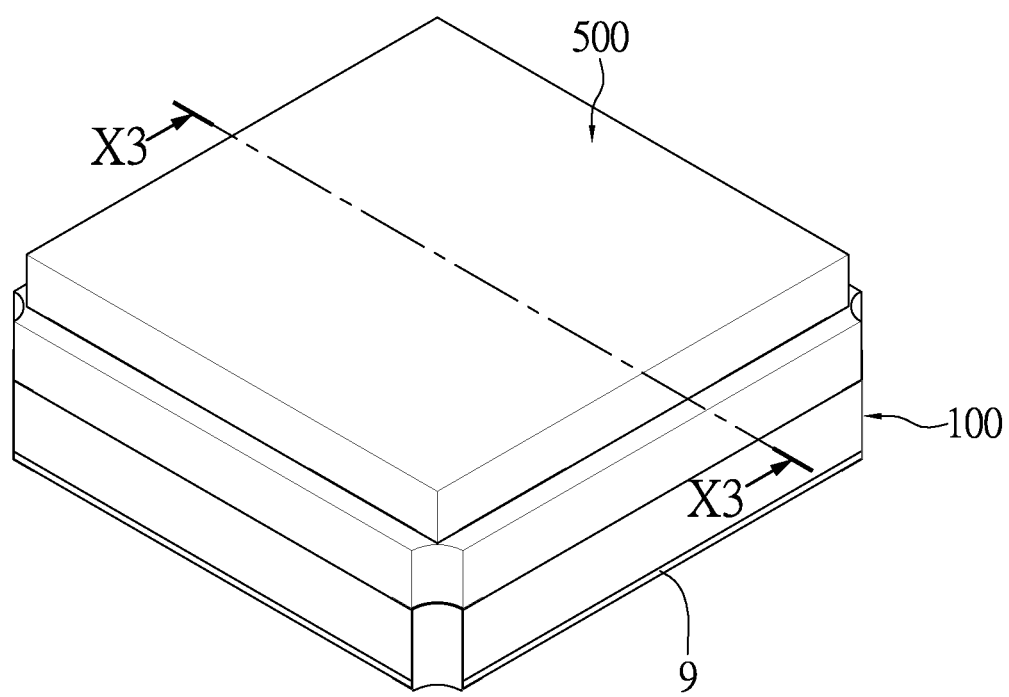
FIG. 22 is a perspective view showing an LED package structure according to a fourth embodiment of the instant disclosure.
Figure 23:
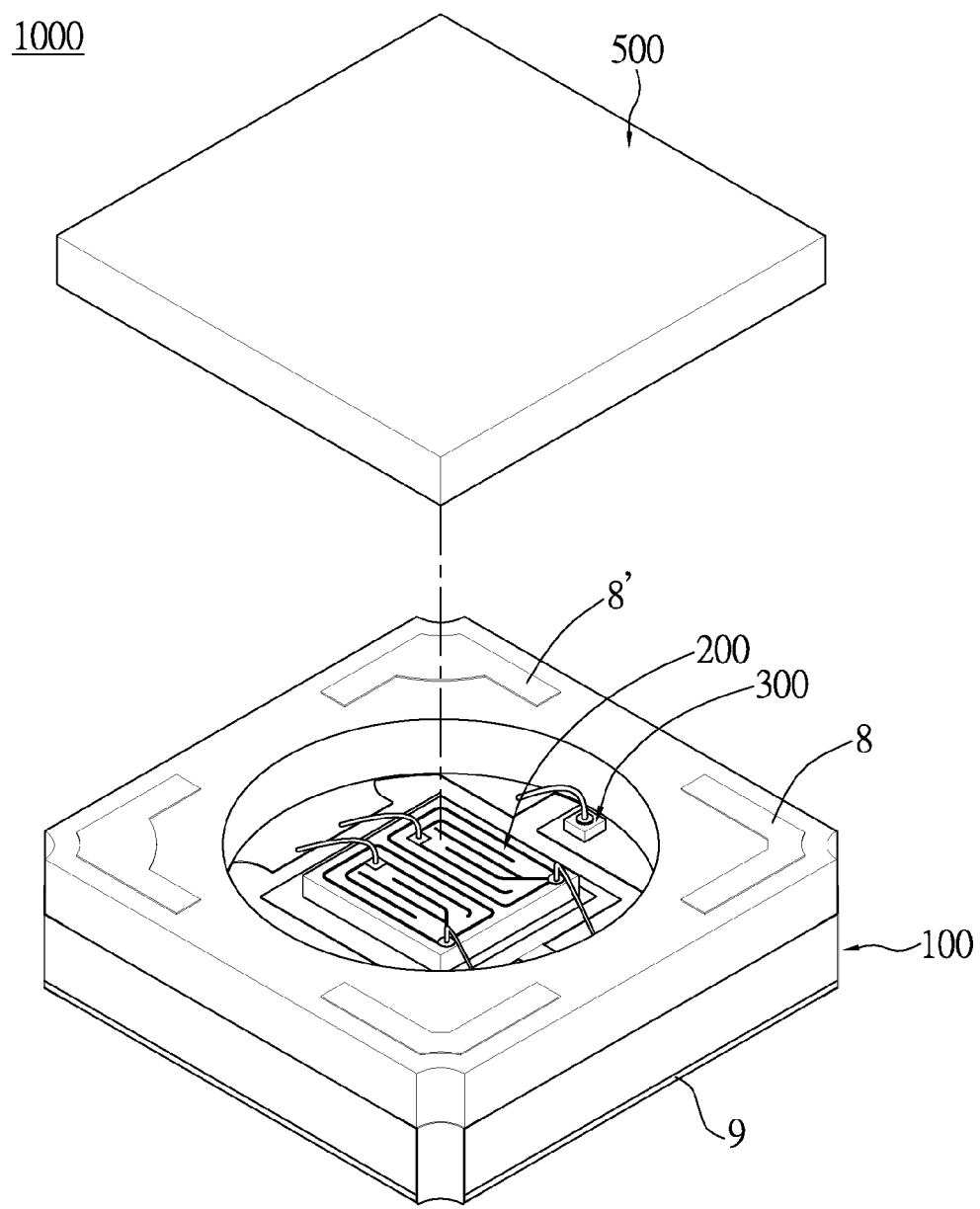
FIG. 23 is an exploded view of FIG. 22.
Figure 24:
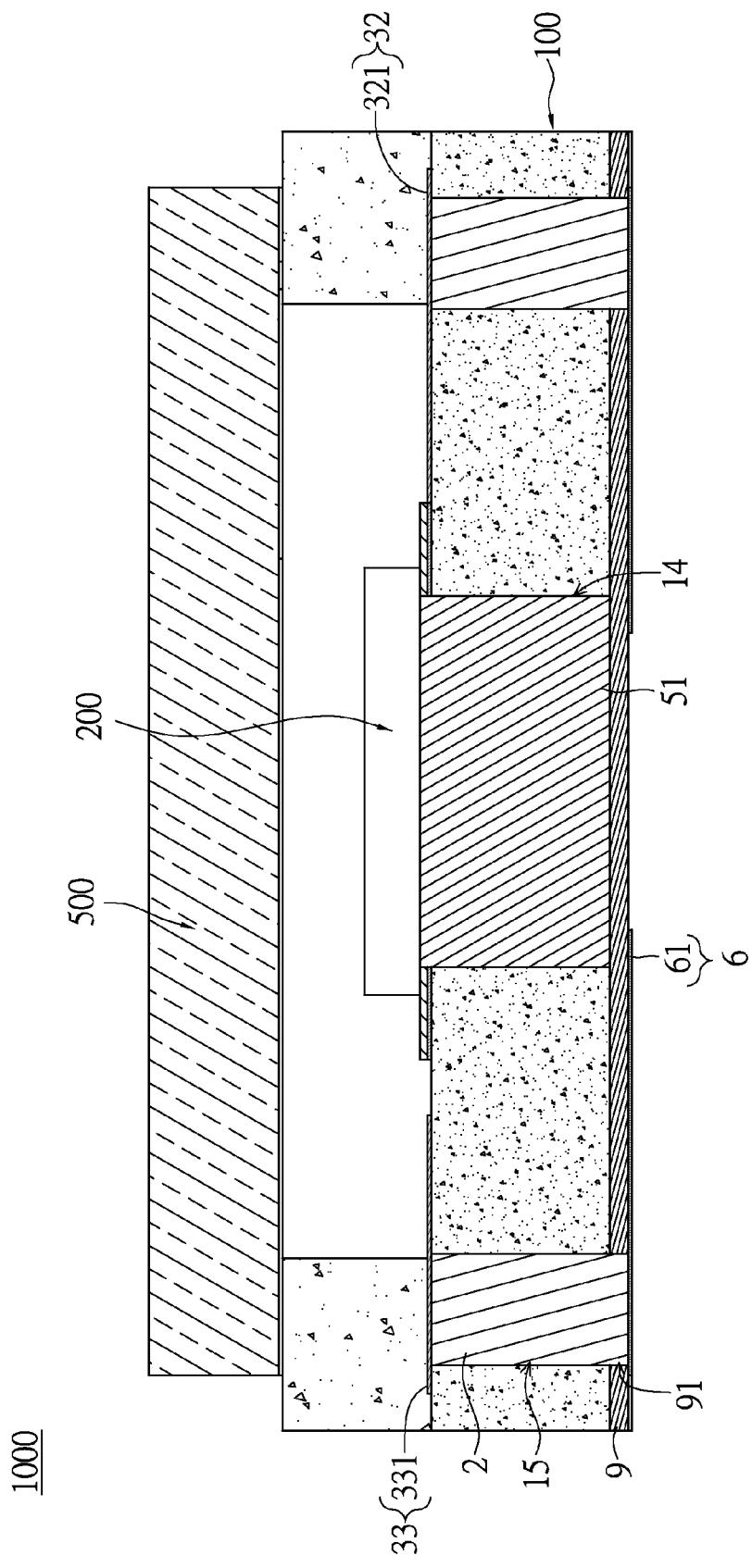
FIG. 24 is a cross-sectional view of FIG. 22 along a line X3-X3.

Please refer to the FIGS. 22 through 24, which show a fourth embodiment of the instant disclosure. The fourth embodiment is similar to the second embodiment, so the same features are not disclosed again. The main different feature of the two embodiments is that the LED package structure 1000 of the instant embodiment further comprises a ceramic interlayer 9 and the solder pad layer 6 of the instant embodiment is different from that of the second embodiment. Specifically, the ceramic interlayer 9 and the solder pad layer 6 of the instant embodiment are respectively identical to that of the third embodiment, so the ceramic interlayer 9 and the solder pad layer 6 of the instant embodiment are not disclosed again.

[The Possible Effect of the Instant Disclosure]

In summary, the LED package structure of the instant disclosure includes the following effects.

The chip carrier of the instant embodiment is provided with the main portion of the metal slug protruding from the accommodating hole, thereby a concave mounting surface of the metal slug is avoided. Moreover, the metal slug is provided with the extending portion to effectively increase an area of mounting surface of the metal slug, thereby the mounting surface of the metal slug allows the LED chips to be applied with different sizes. In addition, the metal slug is electrically connected to the first circuit by establishing a structural connection between the extending portion of the metal slug and the first circuit, such that the mounting surface of the metal slug can be provided for an LED chip having a horizontal structure or an LED chip having a vertical structure.

When the extending circuits are respectively connected to the end portions of the electrically-conductive pads, the solder climbs along the corresponding extending circuits by means of the cohesiveness thereof, thereby effectively increasing the soldering area of the chip carrier.

Each corner of the ceramic substrate and the ceramic reflective plate has a notch corner, thereby preventing a crack from occurring to each corner of the ceramic substrate. Moreover, according to the light reflectivity of the ceramic substrate being greater than that of the silver circuit layer, the first circuit and the second circuit are provided with the notches to expose more area of the first board surface of the ceramic substrate from the ceramic reflective plate via the penetrating hole, such that the lighting efficiency of the LED package structure can be effectively increased.

The polar recognition pads provide a polar recognition function for the LED package structure by respectively arranging the two different shapes of the polar recognition pads above the first and second circuits. Moreover, the cover is adhered to the ceramic reflective plate of the chip carrier by the glass-gel pads, and a plurality of gaps are existed between the cover and the first surface of ceramic reflective plate, thereby air in the penetrating hole of the chip carrier can be communicated with external air. In addition, the spacers are arranged between the first surface of the ceramic reflective plate and the cover, such that the gaps existed between the first surface of the ceramic reflective plate and the bottom surface of the cover can be controlled to a predetermined interval.

When the LED chip arranged in the LED package structure is an UV LED chip and UV light emitted from the UV LED chip is transmitted through the cover, the reflective film is disposed under the cover in position corresponding to the glue slot to effectively shield the adhesives, thereby preventing the adhesives from degradation. The adhesives are usually degraded due to UV light.

The annular blocking layer is disposed on the first surface of the ceramic reflective plate and surrounds the penetrating hole of the ceramic reflective plate for preventing the encapsulation resin from outwardly flowing in a molding process.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. An LED package structure, comprising:
    a chip carrier, comprising:
        a ceramic substrate having a first board surface, a second board surface opposite to the first board surface, and an outer side surface arranged between the first board surface and the second board surface, wherein the ceramic substrate has an accommodating hole penetrating through the first board surface and the second board surface;
        a circuit layer disposed on the first board surface of the ceramic substrate;
    a metal slug, comprising:
        a main portion arranged in the accommodating hole of the ceramic substrate, wherein part of the main portion protruding from the first board surface with a height of 10~30 μm is defined as a protruding block; and
        an extending portion connected to an outer edge of the protrusion block, wherein a surface of the extending portion and a surface of the protrusion block are coplanar and are defined as a mounting surface; and
    a ceramic reflective plate having a first surface, a second surface opposite to the first surface, and a lateral surface arranged between the first and second surfaces, wherein the ceramic reflective plate is disposed on the ceramic substrate and covers part of the circuit layer, the ceramic reflective plate has a penetrating hole penetrating through the first surface and the second surface, the mounting surface of the metal slug is exposed from the ceramic reflective plate via the penetrating hole; and
    an LED chip disposed on the mounting surface of the chip carrier and electrically connected to the circuit layer.

2. The LED package structure as claimed in claim 1, wherein the extending portion has an annular first extending portion and an annular second extending portion disposed on the first extending portion, each of the first extending portion and the second extending portion surrounds the protrusion block of the metal slug.

3. The LED package structure as claimed in claim 2, wherein the circuit layer has a first circuit and a second circuit, the first circuit is connected to the first extending portion and is coplanar with the first extending portion, the second circuit is separated from the extending portion and the first circuit.

4. The LED package structure as claimed in claim 3, wherein each of the first circuit and the second circuit has an L shape and includes a long segment and a short segment perpendicularly connected to the long segment, wherein the long segments of the first and second circuits are respectively arranged at two opposite sides of the mounting surface and are parallel with each other, the short segments of the first and second circuits are arranged between the long segments of the first and second circuits and face with each other.

5. The LED package structure as claimed in claim 4, wherein each of the long segments of the first and second circuits has a notch concavely formed on an inner edge thereof adjacent to the corresponding short segment.

6. The LED package structure as claimed in claim 4, further comprising a Zener-diode chip, wherein the Zener-diode chip is mounted on a portion of the short segment of the first circuit, and the portion of the short segment of the first circuit is exposed from the ceramic reflective plate via the penetrating hole.

7. The LED package structure as claimed in claim 1, wherein each of the ceramic substrate and the ceramic reflective plate has a substantially polygon shape, the outer side surface of the ceramic substrate aligns with the lateral surface of the ceramic reflective plate, the outer side surfaces of the ceramic substrate and the lateral surfaces of the ceramic reflective plate have an arc-shaped notch corner, wherein the chip carrier has a plurality of extending circuits respectively arranged on the notch corners of the ceramic substrate and connecting the circuit layer, wherein the chip carrier has a solder pad layer disposed on the second board surface of the ceramic substrate, the extending circuits are connected to or separated from the solder pad layer.

8. The LED package structure as claimed in claim 1, wherein the chip carrier has a solder pad layer disposed on the second board surface of the ceramic substrate, and the main portion of the metal slug is connected to the solder pad layer.

9. The LED package structure as claimed in claim 8, wherein the solder pad layer has two electrically-conductive pads and a thermally-conductive pad arranged between the two electrically-conductive pads.

10. The LED package structure as claimed in claim 9, wherein the solder pad layer has at least one isolation pad arranged between the thermally-conductive pad and one of the two electrically-conductive pads.

11. The LED package structure as claimed in claim 1, wherein the chip carrier has a ceramic interlayer and a solder pad layer, the ceramic interlayer is arranged between the second board surface of the ceramic substrate and the solder pad layer, the main portion of the metal slug is connected to the ceramic interlayer, and wherein the solder pad layer is disposed under the ceramic interlayer and includes two electrically-conductive pads arranged apart from each other.

12. The LED package structure as claimed in claim 1, further comprising an encapsulation resin arranged in the penetrating hole and encapsulating the LED chip, wherein the chip carrier has an annular blocking layer disposed on the first surface of the ceramic reflective plate, and the annular blocking layer surrounds the penetrating hole of the ceramic reflective plate.

13. The LED package structure as claimed in claim 1, wherein the chip carrier comprises a plurality of polar recognition pads having two different shapes, the polar recognition pads are disposed on the first surface of the ceramic reflective plate and arranged apart from each other.

14. The LED package structure as claimed in claim 1, wherein the circuit layer has a first circuit and a second circuit separated from the first circuit, the chip carrier comprises four polar recognition pads each having a substantially shape, the four polar recognition pads are disposed on the first surface of the ceramic reflective plate and arranged apart from each other, and wherein two of the four polar recognition pads are disposed above the first circuit and each has a right angle corner, and the other two polar recognition pads are disposed above the second circuit and each has an arc corner.

15. The LED package structure as claimed in claim 1, further comprising a cover and a plurality of adhesives, wherein the cover is bonded to the first surface of the ceramic reflective plate by using the plurality of adhesives, the ceramic reflective plate has a plurality of gel slots concavely formed on the first surface thereof, the plurality of adhesives are respectively filled in the plurality of gel slots, and the plurality of adhesives are protruding from the plurality of gel slots.

16. The LED package structure as claimed in claim 10, further comprising a plurality of spacers disposed between the first surface of the ceramic reflective plate and the cover, and the plurality of spacers are arranged between the two adjacent gel slots.

17. The LED package structure as claimed in claim 1, further comprising a nano-silver paste, wherein the LED chip is bonded to the mounting surface of the chip carrier through the nano-silver paste, the nano-silver paste is made of nano-silver powders without epoxy resin.

18. The LED package structure as claimed in claim 17, wherein a volume percentage of the nano-silver powders of the nano-silver paste is about 85~90%; the nano-silver paste has a binder being Isobornyl Cyclohexanol (IBCH) provided with a weight percentage of 2~7% and a solution being 1-decanol provided with a weight percentage of 5~15%; a chemical formula of the nano-silver paste is nAg-m(AgO-OCR-l(AgOR), R=[CH3(CH2)x], and l, m, n, x are positive integers.

19. The LED package structure as claimed in claim 17, wherein part of the nano-silver powders having particle size smaller than 20 nm are provided with a weight percentage of 20~35%; part of the nano-silver powders having particle size of 20~100 nm are provided with a weight percentage of 40~50%.

20. A chip carrier, comprising:
a ceramic substrate having a first board surface, a second board surface opposite to the first board surface, and an outer side surface arranged between the first board surface and the second board surface, wherein the ceramic substrate has an accommodating hole penetrating through the first board surface and the second board surface;
a circuit layer disposed on the first board surface of the ceramic substrate;
a metal slug, comprising:
a main portion arranged in the accommodating hole of the ceramic substrate, wherein part of the main portion protruding from the first board surface with a height of 10~30 μm is defined as a protrusion block; and
an extending portion connected to an outer edge of the protrusion block, wherein a surface of the extending portion and a surface of the protrusion block are coplanar and are defined as a mounting surface; and
a ceramic reflective plate having a first surface, a second surface opposite to the first surface, and a lateral surface arranged between the first and second surfaces, wherein the ceramic reflective plate is disposed on the ceramic substrate and covers part of the circuit layer, the ceramic reflective plate has a penetrating hole penetrating through the first surface and the second surface, the mounting surface of the metal slug is exposed from the ceramic reflective plate via the penetrating hole.

* * * * *